United States Patent [19]
Ikenaga et al.

[11] Patent Number: 5,854,760
[45] Date of Patent: Dec. 29, 1998

[54] TWO-DIMENSIONAL PE ARRAY, CONTENT ADDRESSABLE MEMORY, DATA TRANSFER METHOD AND MATHEMATICAL MORPHOLOGY PROCESSING METHOD

[75] Inventors: Takeshi Ikenaga, Isehara; Takeshi Ogura, Atsugi, both of Japan

[73] Assignee: Nippon Telegraph and Telephone Corporation, Tokyo, Japan

[21] Appl. No.: 745,403

[22] Filed: Nov. 8, 1996

[30] Foreign Application Priority Data

Nov. 10, 1995 [JP] Japan ............................. 317574/1995
Feb. 27, 1996 [JP] Japan ............................. 65356/1996

[51] Int. Cl.$^6$ ............................. G11C 13/00; G11C 15/00
[52] U.S. Cl. ........................................ 365/49; 365/230.01
[58] Field of Search .............................. 365/49, 189.01, 365/230.01

[56] References Cited

FOREIGN PATENT DOCUMENTS

WO-A-9516234  6/1995  European Pat. Off. .

OTHER PUBLICATIONS

Artificial Intelligence and Computer Vision, Proceedings of the Israeli Conference, 1991, pp. 441–453, XP000601131, A.J. Akerib et al., "Real Time Associative Vision Machine", p. 442, line 5, p. 444, line 15; Figures 1,2.

Proceedings of the International Conference on Application Specific Array Processors, Princeton, Sep. 5–7, 1990, No. Conf. 4 Sep. 5, 1990, Sun Yuan Kung, J. Fortes, E. Swartzlander, Wojtek Przytula K., pp. 414–425, XP000245120, A.P. Marriott, "Towards the Automated Design of Application Specific Array Processors (ASAPS)", p. 414, line 1, p. 421, line 3.

IEEE Journal of Solid–State Circuits, vol. 27, No. 12, Dec. 1, 1992, pp. 1927–1933, XP000329045, Tadato Yamagata, et al., "A 288–KB Fully Parallel Content Addressable Memory Using a Stacked Capacitor Cell Structure", p. 1929, paragraph A, p. 1930, figure 5.

IEE Micro, vol. 12, No. 3, Jun. 1, 1992, pp. 31–41, XP000277660 F.P. Herrmann, et al., "A Dynamic Associative Processor for Machine Vision Applications", the whole document.

Symposium on VLSI Circuits, Diges of Technical Papers, Honolulu, Jun. 9–11, 1994, Jun. 9, 1994, Institute of Electrical and Electronics Engineers, p. 99/100 XP000501041, F.P. Herrmann, et al., "A 256–Element Associative Parallel Processor" p. 99, right–hand col., line 1, p. 100, left–hand col., line 3.

Algorithms and Applications, Pennsylvania, Aug. 8–12, 1989, vol. 3, Aug. 8, 1989, F. Ris, P.M. Kogge, pp. III48–55, XP000078438.

B.D. Alleyne, et al., "Image Block Transformations in a Partitioned Parallel Associative Processor", p. III–48, right–hand col., line 18, p. III–50, right–hand col. line 1, figure 1.

(List continued on next page.)

Primary Examiner—Terrell W. Fears
Attorney, Agent, or Firm—Kenyon & Kenyon

[57] ABSTRACT

A two-dimensional PE (processing element) array that can achieve a small amount of hardware, short transfer time and high flexibility. It includes q×r CAMs, where q and r are any integers equal to or greater than two, and hit-flag lines. Each CAM has one-dimensionally arrayed w words, a hit-flag register capable of shift up and shift down, and an upper shift I/O port and a lower shift I/O port for inputting from and outputting to outside the contents of the hit-flag register. Each of the hit-flag lines connects the lower-shift I/O port of one of two horizontally adjacent CAMs with the upper-shift I/O port of the other of the two. The w words are arranged in m rows and n columns and are connected in a zigzag, and each word is assigned to a PE that performs various types of logical and arithmetic operations.

13 Claims, 31 Drawing Sheets

OTHER PUBLICATIONS

IEEE Micro, vol. 12, No. 3, Jun. 1, 1992, pp. 42–55, XP00027766 R. Storer, et al., An Associative Processing Module for A Heterogeneous Vision Architecture, the whole document.

VLSI Design and Cad, Singapore, Jun. 11–14, 1991, vol. 4 of 5, Jun. 11, 1991, Institute of Electrical and Electronics Engineers, pp. 236302366, XP000302882, M.M. Hassoun, "Design, Implementation and Evaluation of a VLSI High Speed Array Processor for Real–Time Image Processing Morphology Operations", the whole document.

"Gray Scale Morphology using 2–D Cellular Automata: $CAM^2$", D–381, p. 384, Takeshi Ikenaga, Takeshi Ogura, NTT LSI Laboratories.

"Discrete–Time CNN using highly parallel 2–D cellular automata $CAM^2$", 5M–5, pp. 2–209–2–210, Takeshi Ikenaga, Takeshi Ogura, NTT System Electronics Laboratories.

"Morphology using two–dimensional Cellular Automata: $CAM^2$", D497, p. 285, Takeshi Ikenaga, Takeshi Ogura, NTT LSI Laboratories.

"Highly parallel type two–dimensional Cellular Automata: $CAM^2$", 5L–7, pp. 6–155–6–156, Takeshi Ikenaga, Takeshi Ogura, NTT LSI Laboratories.

"Neural Network Algorithms on a Highly Parallel Associative Processor", CPSY91–44, pp. 15–22, Takeshi Ogura, Jiro Naganuma, NTT LSI Laboratories.

"$CAM^2$: A Highly–parallel 2–D Cellular Automata Architecture", The Institute of Electronics, Information and Communication Engineers, Technical Report of IEICE, ICD96–15, CPSY96–1, FTS96–15 (1996–04), Takeshi Ikenaga, Takeshi Ogura, NTT LSI Laboratories.

Chua, L.O., et al., "Cellular Neural Networks: Theory", IEEE Trans. on Circuits and Systems, vol. 35, No. 10, Oct. 1988.

Ogura, T., et al., "A 20–kbit Associative Memory LSI for Artificial Intelligence Machines", IEEE J. Solid–State Circuits, vol. 24, No. 4, pp. 1014–1020, Aug. 1989.

P. Maragos, "Tutorial on advances in morphological image processing and analysis", Optical Engineering, vol. 26, No. 7, 1987.

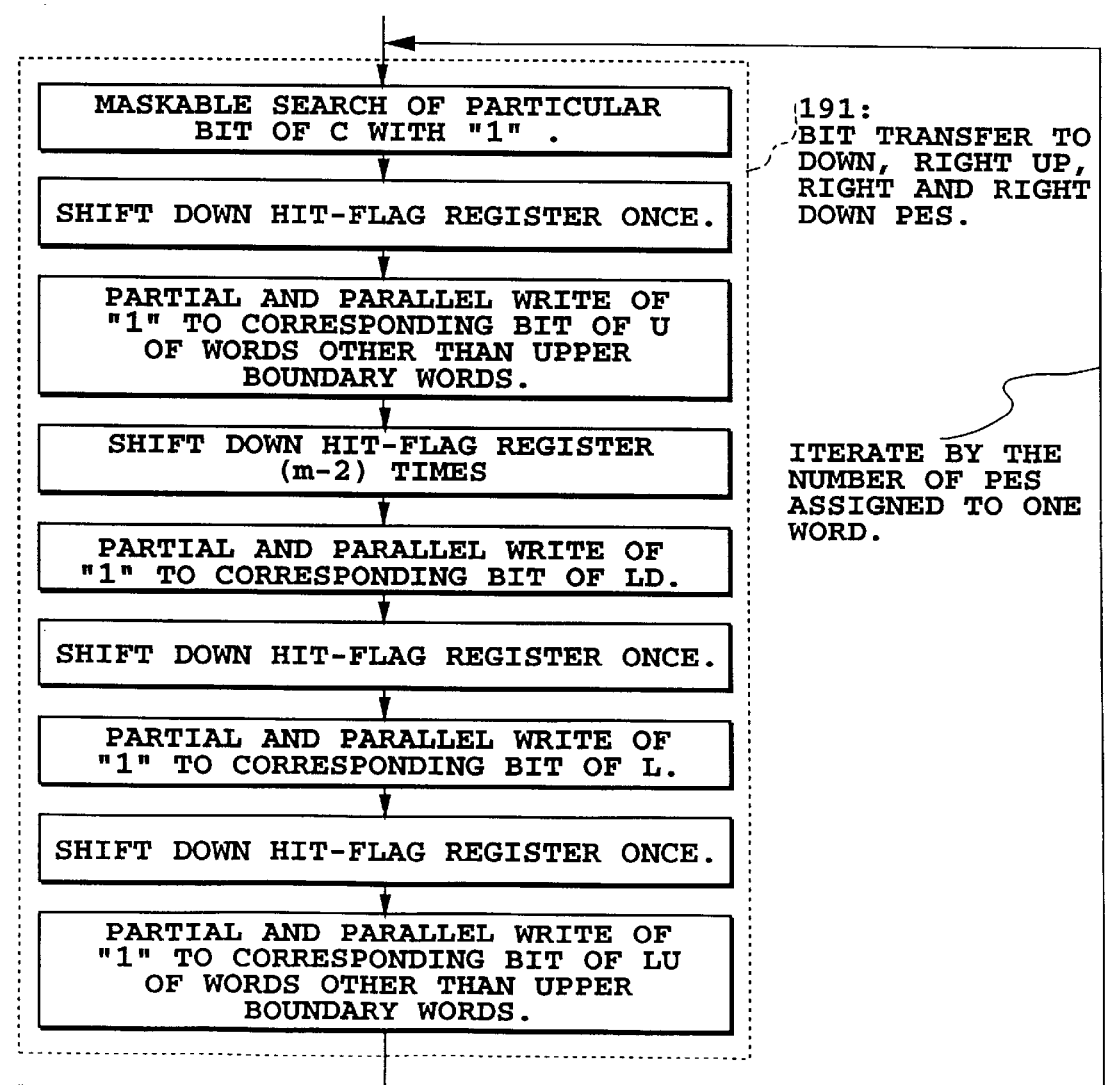

| FIG.21A |
|---|
| FIG.21B |

INNER WORD TRANSFER WHEN TWO PES ARE
ASSIGNED TO EACH WORD OF CAMS (FOUR-NEIGHBOR CASE)

**FIELD STRUCTURE OF CAM WORD
IN MATHEMATICAL MORPHOLOGY**

331: ORIGINAL IMAGE FIELD
332: NEXT IMAGE FIELD
333: SHIFT IMAGE FIELD (UP OR DOWN)
334: SHIFT IMAGE FIELD (UP OR DPWN)
335: SHIFT IMAGE FIELD (LEFT OR RIGHT)
336: WORK FIELD

FIG.25

| FIG.25A |
|---------|
| FIG.25B |

FIG.25A

ENTIRE PROCESSING PROCEDURE IN THE
MATHEMATICAL MORPHOLOGY OPERATION

TRANSFER INDIVIDUAL PIXEL DATA OF ORIGINAL
IMAGE TO C OF CORRESPONDING PE; INITIALIZE C+.

↓

353(1)

351 — TRANSFER OPERATION.
TRANSFER TO C+ OF ORIGINAL PE
DATA OF C OF ORIGINAL AND
RIGHT AND LEFT PES IN ACCORDANCE
WITH DEFINITION OF STRUCTURING
ELEMENT (-X2, 0)-(X1, 0),
FOLLOWED BY OPERATION SUCH AS
LOGICAL OR OPERATION.

352 — IMAGE SHIFT DOWN PROCESSING.
TRANSFER TO $UD_1$ DATA
OF C OF UP PE.

↓

353(2)

351 — TRANSFER OPERATION.
TRANSFER TO C+ OF ORIGINAL PE
DATA OF $UD_1$ OF ORIGINAL AND
RIGHT AND LEFT PES IN ACCORDANCE
WITH DEFINITION OF STRUCTURING
ELEMENT (-X2, 1)-(X1, 1)
FOLLOWED BY OPERATION SUCH AS
LOGICAL OR OPERATION.

352 — IMAGE SHIFT DOWN PROCESSING.
TRANSFER TO $UD_2$ DATA
OF $UD_1$ OF UP PE.

↓

TRANSFER OPERATION (PROCESSING STEP 1)

FIG. 28

PEA11: CONVENTIONAL TWO-DIMENSIONAL PROCESSING ELEMENT (PE) ARRAY
202: PROCESSING ELEMENT (PE)
201: DATA I/O
203: DATA TRANSFER PATH

TWO-DIMENSIONAL PE ARRAY, CONTENT ADDRESSABLE MEMORY, DATA TRANSFER METHOD AND MATHEMATICAL MORPHOLOGY PROCESSING METHOD

BACKGROUND OF THE INVENTION

1. Field of the Invention

The present invention relates to a two-dimensional PE (processing element) array, CAM (content addressable memory), data transfer method and mathematical morphology processing method, which serve for in image processing, audio and speech processing and information processing.

2. Description of Related Art

Demands for high performance image processing, audio and speech processing and information processing are increasing with the visualization and high value addition of network services. These processings, however, are difficult to implement by the conventional microprocessors or digital signal processors based on von Neumann architecture because they need enormously high processing performance.

As an apparatus to perform such processings effectively, a two-dimensional PE (processing element) array is known. The two-dimensional PE array is provided with an enormous number of PEs for carrying out various types of logical and arithmetic operations, and a controller for providing each PE with a single instruction, multiple data stream (SIMD). The two-dimensional PE array is a device comprising a parallel operation mechanism of the PEs and a data transfer mechanism between adjacent PEs in the two-dimensional array by using these circuits and configuration.

Some theories are known which enable the two-dimensional PE array to effectively assign various types of processings, including cellular automaton and cellular neural network (CNN) which are disclosed in Chua, L. O. et al., "Cellular Neural Networks: Theory", IEEE Trans. on Circuits and Systems, Vol. 35, No. 10, October 1988.

FIG. 28 is a block diagram showing a conventional two-dimensional PE array PEA11.

In the conventional two-dimensional PE array, PEs (processing elements) 202, each composed of integrated elements including a microprocessor or an arithmetic unit, are arrayed in two-dimension, X×Y, where X is the number of PEs in the vertical direction and Y is the number of PEs in the horizontal direction, and are connected through data transfer paths 203 provided in the two-dimensional fashion.

The conventional PE array, however, has a problem in that the number of the data transfer paths 203 sharply increases with the number of PEs, thereby increasing the amount of hardware of the two-dimensional PE array.

The amount of hardware is further increased by the fact that it is generally difficult to increase the integration size of the PEs 202 when they are two-dimensionally arrayed. Moreover, the data bit width at data input/output ports 201 increases with the number of the PEs 202, which makes difficult data exchange with outside.

In this case, although the external data exchange can be facilitated by adding a mechanism for compressing the data bit width at the data input/output ports 201, this will arise another problem of making it difficult for the PE array to have flexibility such as changing the number of PEs 202.

FIG. 29 is a block diagram showing another conventional two-dimensional PE array PEA12.

In the conventional two-dimensional PE array, X×Y PEs (processing elements) 212, each composed of integrated elements including a microprocessor or an arithmetic unit, are arrayed in one-dimension, and are connected through data transfer paths 213 as shown in FIG. 29. The PEs 212 are arrayed in a zigzag by every X PEs, so that a pseudo-two-dimensional PE array with X×Y PEs is implemented.

In this system, the one-dimensional data transfer paths 213 are employed for transferring data to adjacent PEs 212 in the two-dimensional array using the PEs 212 as an intermediary.

The conventional PE array, however, presents a problem in that the transfer time increases because the data must pass through X PEs to be transferred between horizontally adjacent PEs in FIG. 29, thereby resulting in an enormous increase in the total transfer time.

To shorten the transfer time between the horizontally adjacent PEs, dedicated paths can be provided. This, however, will presents another problem in that the amount of hardware will increase because of an increase in the number of the data transfer paths as in the foregoing example employing the two-dimensional data transfer paths 203.

FIG. 30 is a block diagram showing a conventional CAM (content addressable memory) M11.

The conventional CAM M11 comprises, as shown in FIG. 30, words $224_{(1)-(w)}$, a mask register 222, an address decoder 225, and a hit-flag register 227 that can be utilized as a one-dimensional data transfer path between the words $224_{(1)-(w)}$. The CAM M11 is disclosed in T. Ogura, et al., "A 20-kbit Associative Memory LSI for Artificial Intelligence Machines", IEEE J. Solid-State Circuits, Vol. 24, No. 4, pp. 1014–1020, August 1989.

The CAM M11 can read or write data from or to any word $224_{(1)-(w)}$ by providing an address input port 223 with an address as in a common memory. In addition, it has a maskable search function, and a partial and parallel write function, and by using these functions, it can perform various logical and arithmetic operations simultaneously on the entire words. Accordingly, applying the CAM to a two-dimensional PE array can implement a highly parallel computer with an enormous number of PEs.

The hit-flag register 227 that can be utilized as a one-dimensional data transfer path between the words $224_{(1)-(w)}$, however, has only a unidirectional shift mode in which only shift up or shift down of the data can be achieved. This presents a problem in that the data transfer between the words $224_{(1)-(w)}$ can only be carried out effectively in specific one direction. In addition, since the conventional system does not have a mode which simultaneously performs both the data read write and the shift in the hit-flag register, it has a problem in that it cannot achieve the effective data transfer processing.

Therefore, the two-dimensional PE array structured by using the foregoing CAMs has a problem in that its data transfer time is rather long.

In the image processing algorithm, it is usually effective to adopt one to one correspondence between the pixels of an image and the two-dimensional PEs, in which case many PEs are needed such as 65,536 PEs for 256×256 pixels. Thus, a two-dimensional PE array is needed which can mount a great number of PEs. Accordingly, if the two-dimensional PE array is arranged with multiple boards, it will become very expensive. To avoid this, it is required that the two-dimensional PE array including many PEs be implemented with a hardware amount of about a single board.

In addition, since real time processing is usually required in the image processing, a two-dimensional PE array is required which can implement the real time processing in various types of image processing by suppressing not only the operation time in each PE, but also the data transfer time between the adjacent PEs in the two-dimensional array as much as possible.

Parallelism in the image processing, audio and speech processing and information processing takes diverse forms in accordance with the types of processings, and hence the PE arrangement required of the two-dimensional PE array is also diverse. In view of this, a highly flexible two-dimensional PE array is desired in which the PE arrangement can be changed freely.

A mathematical morphology processing is a theoretical system which provides a consistent method for transforming an object image constructed with the operation based on the set theory. It is widely used for feature extraction, shape representation, or shape recognition of binary and gray scale images. Details of the mathematical morphology processing is disclosed in P. Maragos, "Tutorial on advances in morphological image processing and analysis", Optical Engineering, Vol. 26, No. 7, 1987, for example. As a conventional mathematical morphology processor, is known one disclosed in M. Hassoun, et al., "A VLSI gray-scale morphology processor for real-time NDE image processing applications", SPIE, Vol. 1350, Image Algebra and Morphological Image Processing, 1990.

FIG. 31 is a block diagram showing a conventional mathematical morphology processor MS0.

The conventional mathematical morphology processor MSO comprises a 5×5 PE array 83, an exclusive OR 81 and a comparator 82. It performs the mathematical morphology processing by carrying out arithmetic operation and comparing operation while scanning an original image with the PE array 83.

The conventional mathematical morphology processor MS0, however, has a problem in that it cannot handle a structuring element with a size greater than 5×5 which is the size of the PE array 83. In addition, since it takes a processing time in proportion to the size of an original image, it has a problem in that the mathematical morphology processing time increases with the size of the original image. Furthermore, it presents a problem in that its hardware amount increases because the number of PEs in the PE array 83 must be increased to handle a large structuring element, and the amount of wiring between adjacent PEs increases with the number of the PEs in the PE array 83.

To enable the mathematical morphology processing to be applied to various types image processings, it is necessary to perform the real time processing (at a video rate) of a large original image and a large structuring element, and such a mathematical morphology processor is required.

One of the features of the mathematical morphology is the very high parallelism resulting from the fact that an original image can be handled by operations only between the nearest neighbors. Accordingly, to implement a high performance mathematical morphology processor, it is necessary to take the maximum advantage of this feature and to implement the mathematical morphology processor including PEs having one-to-one correspondence with the pixels.

In this case, however, about 260,000 PEs are needed to process a 512×512 image, for example. Thus, a mathematical morphology processor is required that can mount an enormous number of PEs.

This also requires multiple boards, thereby sharply increasing its cost. Accordingly, it is preferable that the mathematical morphology processor including a large number of PEs be realized with a hardware amount of about a single board to suppress its cost.

SUMMARY OF THE INVENTION

It is therefore an object of the present invention to provide a two-dimensional PE array, CAM and data transfer method, with a small amount of hardware, a short transfer time, and high flexibility.

It is another object of the present invention to provide a high performance mathematical morphology processor with a small hardware amount.

According to a first aspect of the present invention, there is provide a two-dimensional PE (processing element) array comprising PEs, each of the PEs comprising:

q×r CAMs (content addressable memories), where q and r are any integers equal to or greater than two, each of the CAMs including one dimensionally arrayed w words, where w is any natural number, a hit-flag register having shift up and shift down functions, and an upper shift I/O port and a down shift I/O port for inputting from or outputting to outside contents of the hit-flag register; and hit-flag shift lines for connecting the lower shift I/O port of one CAM of two horizontally adjacent CAMs in the CAMs to the upper shift I/O port of the other CAM of the two horizontally adjacent CAMs, wherein each of the w words in each of the CAMs is mapped successively to at least one of PEs which are arranged in m rows by n columns and are connected in a zigzag, where w,m and n are any natural numbers satisfying w=m×n, thereby forming a CAM array comprising m×q PEs in vertical direction and n×r PEs in a horizontal direction.

Here, the two-dimensional PE array may further comprise a controller for generating a single control instruction stream to be supplied to a CAM array formed by the CAMs and the hit-flag shift line.

In the two-dimensional PE array, a plurality of PEs may be mapped to each word of the CAMs, wherein one of the plurality of PEs mapped to each word of the CAMs may comprise its current value field, its next value field, and a current value field and a next value field of its neighboring PEs. According to a second aspect of the present invention, there is provide a CAM (content addressable memory) comprising:

means for writing and reading data to and from words by using an address;

shift mode means for shifting contents of a hit-flag register; and means for simultaneously carrying out the shifting of the contents of the hit-flag register and the writing and reading of the data to and from the words by using an address.

In the two-dimensional PE array, the CAM may comprise means for writing and reading data to and from words by using an address;

shift mode means for shifting contents of a hit-flag register; and means for simultaneously carrying out the shifting of the contents of the hit-flag register and the writing and reading of the data to and from the words by using an address.

Here, in the two-dimensional PE array, the CAM may comprise means for writing and reading data to and from words by using an address;

shift mode means for shifting contents of a hit-flag register; and means for simultaneously carrying out the shifting of the contents of the hit-flag register and the writing and reading of the data to and from the words by using an address.

And here, in the two-dimensional PE array, the CAM may comprise means for writing and reading data to and from words by using an address;

shift mode means for shifting contents of a hit-flag register; and means for simultaneously carrying out the shifting of the contents of the hit-flag register and the writing and reading of the data to and from the words by using an address.

According to a third aspect of the present invention, there is provide a data transfer method in a two-dimensional PE array comprising the steps of:

forming a one-dimensional array of w words, where w is any natural number;

transferring data between q×r CAMs (content addressable memories), where q and r are any integers equal to or greater than two, by external input and output of contents of a hit-flag register through an upper shift I/O port and a lower shift I/O port, the hit-flag register having shift up and shift down functions;

connecting with hit-flag shift lines the lower shift I/O port of one CAM of two horizontally adjacent CAMs of the CAMs to the upper shift I/O port of the other CAM of the two horizontally adjacent CAMs;

arranging w words in each of the CAMs in m rows by n columns in a zigzag fashion, where m and n are any natural number satisfying w=m×n and mapping each of the w words in the CAMs to at least one of the PEs.

Here, the data transfer method may further comprise the steps of: mapping a plurality of PEs to each word of the CAMs; and providing one of the plurality of PES mapped to each word of the CAMs with a current value field and a next value field of the one of the plurality of PEs, and with a current value field of its neighboring PEs.

According to a fourth aspect of the present invention, there is provide a data transfer method between CAMs (content addressable memories) comprising the steps of:

forming a one-dimensional array of w words, where w is any natural number;

transferring data between q×r CAMs, where q and r are any integers equal to or greater than two, by external input and output of contents of a hit-flag register through an upper shift I/O port and a lower shift I/O port, the hit-flag register having shift up and shift down functions; and performing data transfer simultaneously from odd row CAMs to even row CAMs, and from the even row CAMs to the odd row CAMs of the CAMs arranged in q rows, the data transfer being carried out simultaneously for entire CAMs in each of the rows of the CAMs.

According to a fifth aspect of the present invention, there is provide a data transfer method in CAM (content addressable memory) comprising the steps of:

forming a one-dimensional array of w words, where w is any natural number;

executing maskable search comparing data stored in the word with search data and ignoring the comparison of part of the search data;

transferring a content of a particular bit of a first word specified by the maskable search to a first hit-flag register having shift up and shift down functions;

shifting up or shifting down the first hit-flag register having the trasferred content and transferring the shifted content to a second hit-flag register of a second word; and transferring the content of the second hit-flag register to a particular bit of a second word, by using a partial and parallel write writing the search data into a bit of the second word corresponding to an unmasked bit of the search data, wherein the second hit-flag register of the second word has a particular value.

According to a sixth aspect of the present invention, there is provide a CAM (content addressable memory) data transfer method comprising the steps of:

writing and reading data to and from words by using an address;

carrying out a shift mode of a hit-flag register; and performing simultaneously the shift mode of the hit-flag register and the writing and reading of the data to and from the words by using an address.

According to a seventh aspect of the present invention, there is provide a two-dimensional PE array comprising:

q×r CAMs (content addressable memories), where q and r are any integers equal to or greater than two, each of the CAMs including one dimensionally arrayed w words each of which has an original image field, a next image field and a shift image field, where w is any natural number, a hit-flag register having shift up and shift down functions, and an upper shift I/O port and a down shift I/O port for inputting from or outputting to outside contents of the hit-flag register;

hit-flag connection lines for connecting the lower shift I/O port of one CAM of two horizontally adjacent CAMs of the CAMs to the upper shift I/O port of the other CAM of the two horizontally adjacent CAMs; wherein each of the w words in each of the CAMs is mapped successively to at least one of PEs which are arranged in m rows by n columns and are connected in a zigzag, where w, m and n are any natural numbers satisfying w=m×n, thereby forming a CAM array comprising m×q PEs in vertical direction and n×r PEs in a horizontal direction; and a controller for providing the CAM array with a single control instruction stream.

According to an eighth aspect of the present invention, there is provide a mathematical morphology processing method using a two-dimensional PE array comprising the steps of:

forming a one-dimensional array of w words, where w is any natural number;

providing each of the w words with an original image field, a next image field, a right and left image field, and two up and down image fields;

transferring contents of a hit-flag register between q×r CAMs (content addressable memories), where q and r are any integers equal to or greater than two, through an upper shift I/O port and a lower shift I/O port, the hit-flag register having shift up and shift down functions;

connecting with hit-flag shift lines the lower shift I/O port of one CAM of two horizontally adjacent CAMs of the CAMs to the upper shift I/O port of the other CAM of the two horizontally adjacent CAMs;

forming a CAM array including m x q PEs in a vertical direction and n×r PEs in a horizontal direction by mapping each of the w words in each of the CAMs to at least one of PEs which are arranged in m rows by n columns and are connected in a zigzag, where w, m and n are any natural numbers satisfying w=m×n;

providing the CAM array with a single control instruction stream;

sequentially transferring, to the right and left image field, data in one of the original image field and the up and down image fields of horizontally adjacent PEs, performing an operation using transferred data, and storing a result of the operation into the next image field;

carrying out image shift up and down by transferring data in the original image field or one of the up and down shift image fields of up and down PEs to the other of the up and down shift image fields; and iterating the step of sequentially transferring and the step of carrying out image shift up and down until all data transfer and operation associated with up, down, right and left PEs have been completed.

Here, the mathematical morphology processing method may further comprise the steps of:

transferring data of respective elements of an original image to an original image field of corresponding PEs in the two-dimensional PE array; and performing data transfer from any PEs in up, down, right and left which are defined by a structuring element, and carrying out the operation using transferred data.

The mathematical morphology processing method may further comprise:

a data transfer step of iterating maskable search, m times of shift up or shift down operation of the hit-flag register, and partial and parallel write by the number of bits of data, the maskable search being performed to a particular bit of one of the original image field and the up and down shift image fields, and the partial and parallel write being performed to a corresponding bit of the right and left shift image field;

an operation step of performing an operation on the next image field and the right and left image field only when data in the right and left image field is data from a PE on which the operation is to be performed, and storing a result of the operation into the next image field; and a step of iterating the data transfer step and the operation step until all the processing of the step of sequentially transferring has been completed.

The mathematical morphology processing method may further comprise:

an inner word transfer step of iterating by the number of bits of data, a maskable search, one step of shift up or shift down, and a partial and parallel write, the maskable search being performed to a particular bit of an original image field or one of the up and down shift image fields, and the partial and parallel write being performed to a corresponding bit of the other up and down shift image fields; and a step of transferring, by using read and write function of data to words using an address of the CAM, entire bits of the original image field or one of the up and down shift image fields of a particular word of one of upper boundary words and lower boundary words in one of odd row CAMs and even row CAMs, to the other of the up and down image fields of corresponding one of the even row CAMs and the odd row CAMs.

According to the first aspect of the present invention, since the total data transfer time is suppressed, and an amount of hardware is reduced, a high performance two-dimensional PE array can be implemented.

Adding the controller can further shorten the transfer time of the two-dimensional PE array.

Mapping a plurality of PEs to each word can reduce an amount of hardware, and a two-dimensional PE array an amount of hardware, and a two-dimensional PE array can be implemented with many PEs.

According to the second aspect of the present invention, since means is provided for simultaneously carrying out the shift of the contents of the hit-flag register and the writing and reading of the data to and from the words by using an address, the CAM can be implemented with the total data transfer time being further suppressed.

Using the CAM which further suppressed the total data transfer time can further shorten the transfer time of the two-dimensional PE array.

According to the third aspect of the present invention, since the total data transfer time is suppressed, a CAM data transfer method can be implemented of a short transfer time.

Mapping a plurality of PEs to each word can still shorten the transfer time of the data transfer method.

According to the fourth aspect of the present invention, since the total data transfer time is further suppressed, a data transfer method can be implemented of a shorter transfer time.

According to the fifth aspect of the present invention, since the total data transfer time is further suppressed, a data transfer method can be implemented of a shorter transfer time.

According to the sixth aspect of the present invention, since the total data transfer time is further suppressed, a CAM data transfer method can be implemented of a shorter transfer time.

According to the seventh aspect of the present invention, a high performance two-dimensional array can be implemented with the total data transfer time suppressed, and an amount of hardware reduced.

According to the eighth aspect of the present invention, since the total data transfer time is suppressed, and an amount of hardware is reduced, a high performance mathematical morphology processing method can be implemented.

Adding other steps can further suppress the total data transfer time and reduce the amount of hardware, thereby making it possible to implement a higher performance mathematical morphology processing method.

The above and other objects, effects, features and advantages of the present invention will become more apparent from the following description of the embodiments thereof taken in conjunction with the accompanying drawings.

BRIEF DESCRIPTION OF THE DRAWINGS

FIG. 7 is a diagram illustrating the relationship between FIG. 7A and FIG. 7B;

FIG. 19 is a diagram illustrating the relationship between FIG. 19A and FIG. 19B;

FIG. 19A is a flowchart illustrating an eight-neighbor inner word transfer procedure associated with inner word transfer 171 of data transfer 173 to the neighboring PEs;

FIG. 25 is a diagram illustrating the relationship between FIG. 25A and FIG. 25B;

FIG. 25A is a flowchart illustrating an overall output procedure of the mathematical morphology processor in the embodiment;

FIG. 28 is a block diagram showing a conventional two-dimensional PE array PEA11;

DETAILED DESCRIPTION OF PREFERRED EMBODIMENTS

The invention will now be described with reference to the accompanying drawings.

EMBODIMENT 1

Figure 1:
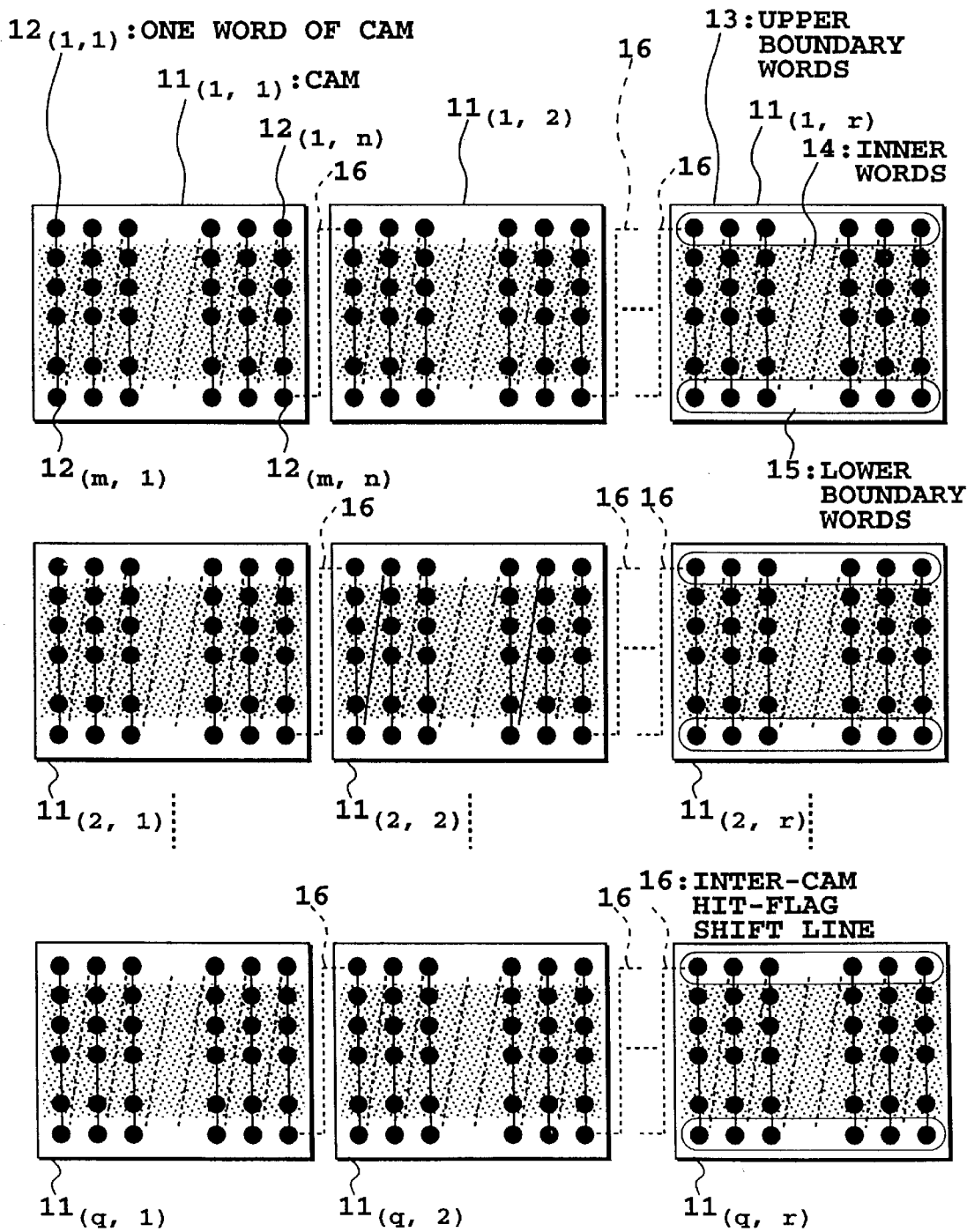
FIG. 1 is a block diagram showing a basic structure of an embodiment of a two-dimensional PE array PEA1 in accordance with the present invention.

FIG. 1 is a block diagram showing the fundamental structure of an embodiment of the two-dimensional PE (processing element) array PEA1 in accordance with the present invention.

The two-dimensional PE array PEA1 comprises two-dimensionally arrayed CAMs 11, and inter-CAM hit-flag shift lines 16 interconnecting two CAMs.

To refer to individual CAMs separately, designation such as CAM $11_{(1,1)}$ is employed instead of the general designation as CAM 11. Likewise, designation such as word $24_{(1)}$ or word $12_{(1,1)}$ is used to refer to individual words rather than the general designation as words 24 or words 12.

The two-dimensional PE array PEA1 comprises q×r two-dimensionally arrayed content addressable memories (CAMs) 11, where q and r are any integers equal to or greater than two, and inter-CAM hit-flag shift lines 16 which interconnect two CAMs 11 and 11.

Each CAM 11 includes w one-dimensionally arrayed words, where w is a natural number, a hit-flag register capable of shift up and shift down, and an upper shift I/O port and a lower shift I/O port, each of which externally inputs or outputs the contents of the hit-flag register. The hit-flag lines 16 connect the lower shift I/O port of one of two horizontally adjacent CAMs with the upper shift I/O port of the other of the two adjacent CAMs of the q×r CAMS. Thus, the two-dimensional PE array includes q×r PEs, each of which is mapped to each one of w CAM words arranged in m columns and n rows in a zigzag to perform various types of logical and arithmetic operations.

Figure 2:
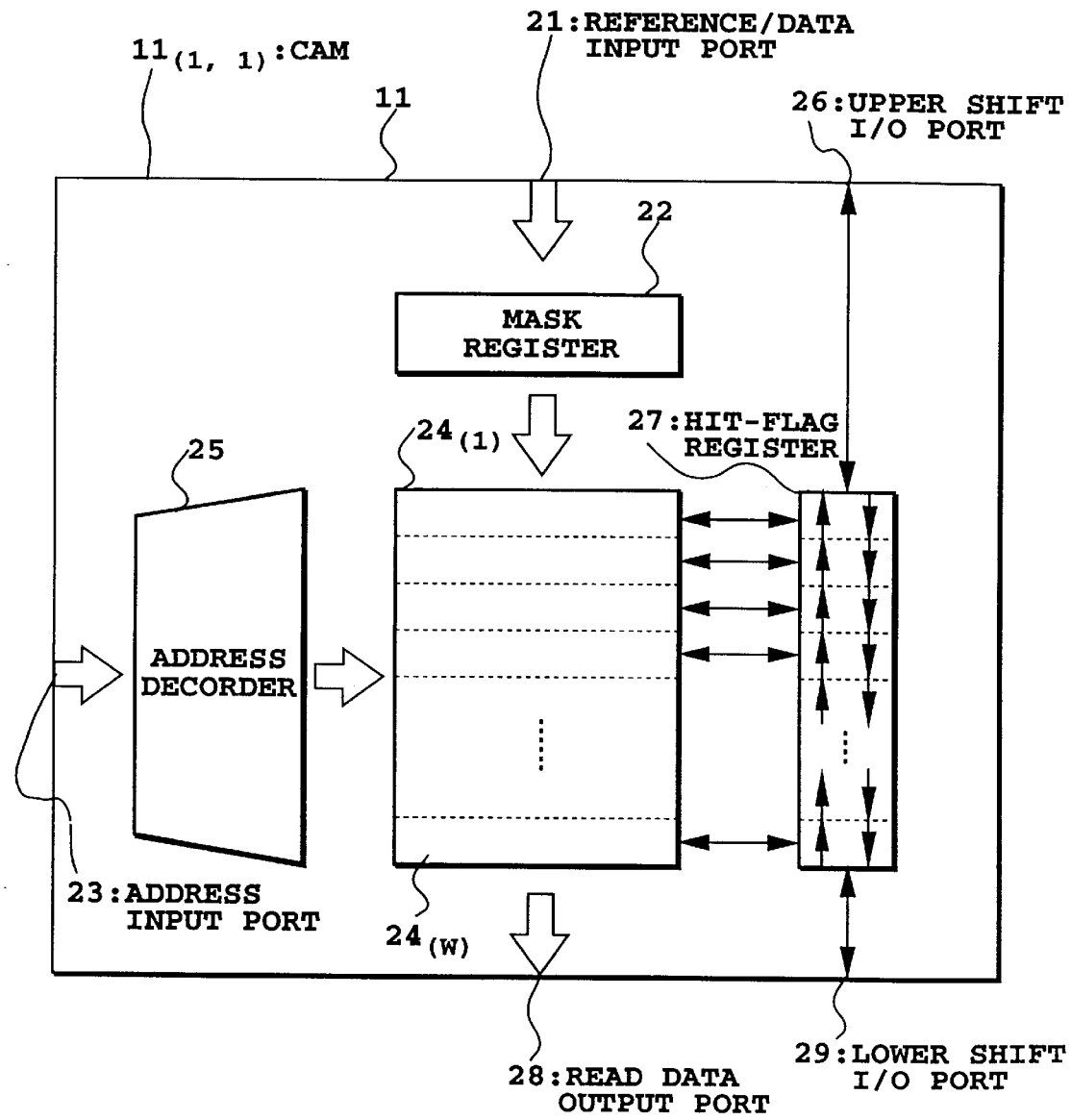
FIG. 2 is a block diagram showing a CAM $11_{(1,1)}$ constituting the two-dimensional PE array PEA1.

FIG. 2 is a block diagram showing a CAM $11_{(1,1)}$ constituting the two-dimensional PE array PEA1. The CAM $11_{(1,1)}$ comprises a reference/data input port 21, a mask register 22, an address input port 23, words 24, an address decoder 25, an upper shift I/O port 26, a hit-flag register 27 for transferring the contents of the words 24 by shift up and shift down, a read data output port 28, and a lower shift I/O port 29. The total number w of words 24 in the CAM $11_{(1,1)}$ is w=m×n, where w, m and n are any natural numbers satisfying the equation. The words 24 in FIG. 2 are identical to the words 12 in FIG. 1: that is, the words $24_{(1)}$–$24_{(w)}$ correspond to the word $12_{(1,1)}$–$12_{(m,n)}$. Since the other CAMs $11_{(2,1)-11(q,r)}$ have the same arrangement as the CAM $11_{(1,1)}$, the CAM $11_{(1,1)}$ will be described representatively.

The CAM $11_{(1,1)}$ comprises data write, data read, maskable search and partial and parallel write functions.

The data write is a function that writes data into any desired word 24 in the CAM $11_{(1,1)}$ by providing the address input port 23 with an address, and the reference/data input port 21 with write data.

The data read is a function that reads data from any desired word 24 in the CAM $11_{(1,1)}$ and outputs the read data from the output port 28 by providing the address input port 23 with an address.

The maskable search is a function that parallelly compares search data applied to the reference/data input port 21 with data stored in the words 24, writes the compared result to the hit-flag register 27, while ignoring the comparison of part of the search data, by providing the mask register 22 with the bit positions to be masked. In addition, setting in the mask register 22 data that masks bits other than a particular bit makes it possible to transfer the particular bit in the words 24 to the hit-flag register 27.

The partial and parallel write is a function that writes data into a particular bit of a word whose hit-flag register 27 is "1", the particular bit corresponding to an unmasked bit of the data at the reference/data input port 21.

The hit-flag register 27 has a bidirectional shift mode of shift up and shift down which are switched by a selector not shown, thus enabling the external serial read write of the CAM $11_{(1,1)}$ through the upper shift I/O port 26 and the lower shift I/O port 29.

As shown in FIG. 1, the two-dimensional PE array PEA1 includes X×Y PEs (processing elements), which are divided into q rows by r columns of blocks, each block corresponding to one CAM 11, where X is the number of the PEs in each column, and Y is the number of PEs in each row, and where X=mq, Y=nr, q and r are any integers equal to or greater than two.

The CAM 11 assigned to each block is constructed such that the w words 12 are divided into every (X÷q) to be arranged in a zigzag, thereby forming (X÷q)×(Y÷r) elements which are assigned to the block of the PEs.

Thus, one CAM 11 can mount m×n PEs, where m is a natural number satisfying m=X÷q, and n is a natural number satisfying n=Y÷r. Accordingly, the two-dimensional PE array PEA1 is implemented including X=m×q and Y=n×r PEs in vertical and horizontal directions, respectively.

Two horizontally adjacent CAMs are linked through the inter-CAM hit-flag shift line 16. Specifically, the upper shift I/O port 26 of the CAM 11 and the lower shift I/O port 29 of horizontally adjacent CAM 11 are connected through the inter-CAM hit-flag line 16. For example, the lower shift I/O port 29 of the CAM $11_{(1,1)}$ is connected to the upper shift input/output port 26 of the horizontally adjacent CAM $11_{(1,2)}$ through the inter-CAM hit-flag shift line 16. Accordingly, operations such as the shift up or shift down can be integrally handled as in the same CAM between the horizontally adjacent CAMs 11 and 11.

Figure 3:
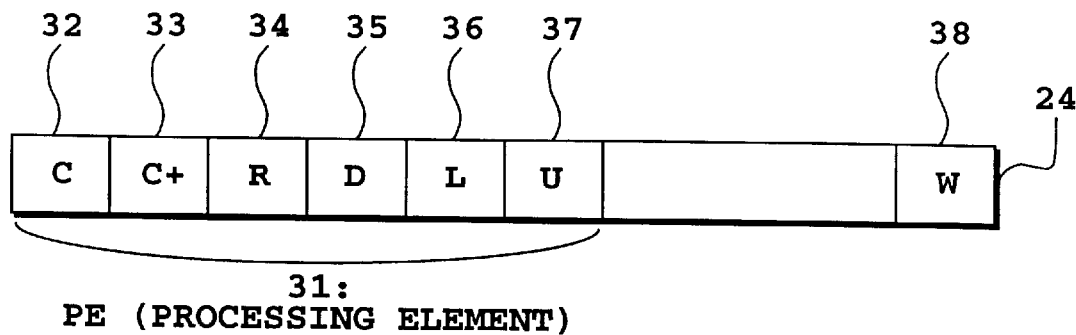
FIG. 3 is a diagram illustrating the word mapping of the CAM $11_{(1,1)}$ when data transfer is carried out to the four neighboring PEs, that is, to the right, down, left and up PEs in the embodiment.

FIG. 3 is a diagram illustrating the word mapping in the CAM $11_{(1,1)}$ in the case where data is transferred to the four neighbors, right, down, left, and up neighbors in this embodiment.

As shown in FIG. 3, a PE 31 comprises a current value field C 32, a next value field C+ 33, a right PE value field R 34, a down PE value field D 35, a left PE value field L 36, and an up PE value field U 37.

A work field W 38 is a temporary field for various calculations using data in the current value field C 32 and the neighboring PEs (the right PE value field R 34, the down PE value field D 35, the left PE value field L 36, and the up PE value field U 37).

Figure 4:
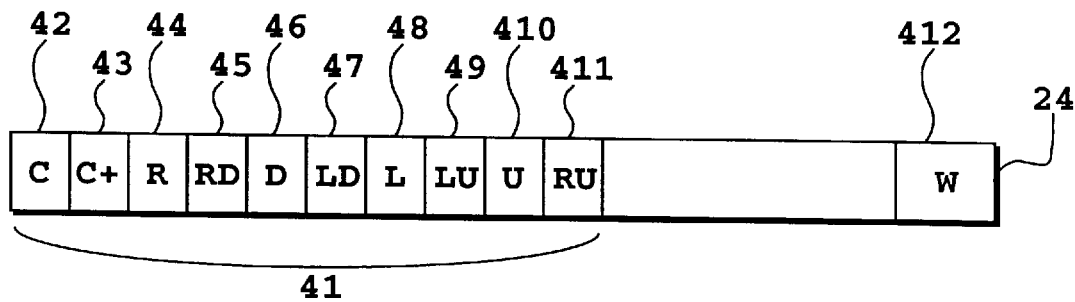
FIG. 4 is a diagram illustrating the word mapping of the CAM $11_{(1,1)}$ when data transfer is carried out to the eight neighboring PEs, that is, to the right, right down, down, left down, left, left up, up and right up PEs in the embodiment.

FIG. 4 is a diagram illustrating the word mapping in the CAM $11_{(1,1)}$ in the case where data is transferred to the eight neighbors, right, right down, down, left down, left, left up, up, and right up neighbors in this embodiment.

As shown in FIG. 4, a PE 41 comprises a current value field C 42, a next value field C+ 43, a right PE value field R 44, a right down PE value field RD 45, a down PE value field D 46, a left down value field LD 47, a left PE value field L 48, a left up PE value field LU 49, an up PE value field U 410, and a right up value field RU 411.

A work field W 412 is a temporary field used for various calculations using data in the current value field C 42, and the neighboring PEs (the right PE value field R 44, the right down PE value field RD 45, the down PE value field D 46, the left down value field LD 47, the left PE value field L 48, the left up PE value field LU 49, the up PE value field U 410, and the right up value field RU 411).

The word mapping of the CAM $11_{(1,1)}$ can be performed in the same fashion as illustrated in FIGS. 3 and 4, when data is transferred to 24 or more neighboring PEs including data transfer to PEs separated apart by a distance of two.

Figure 5:
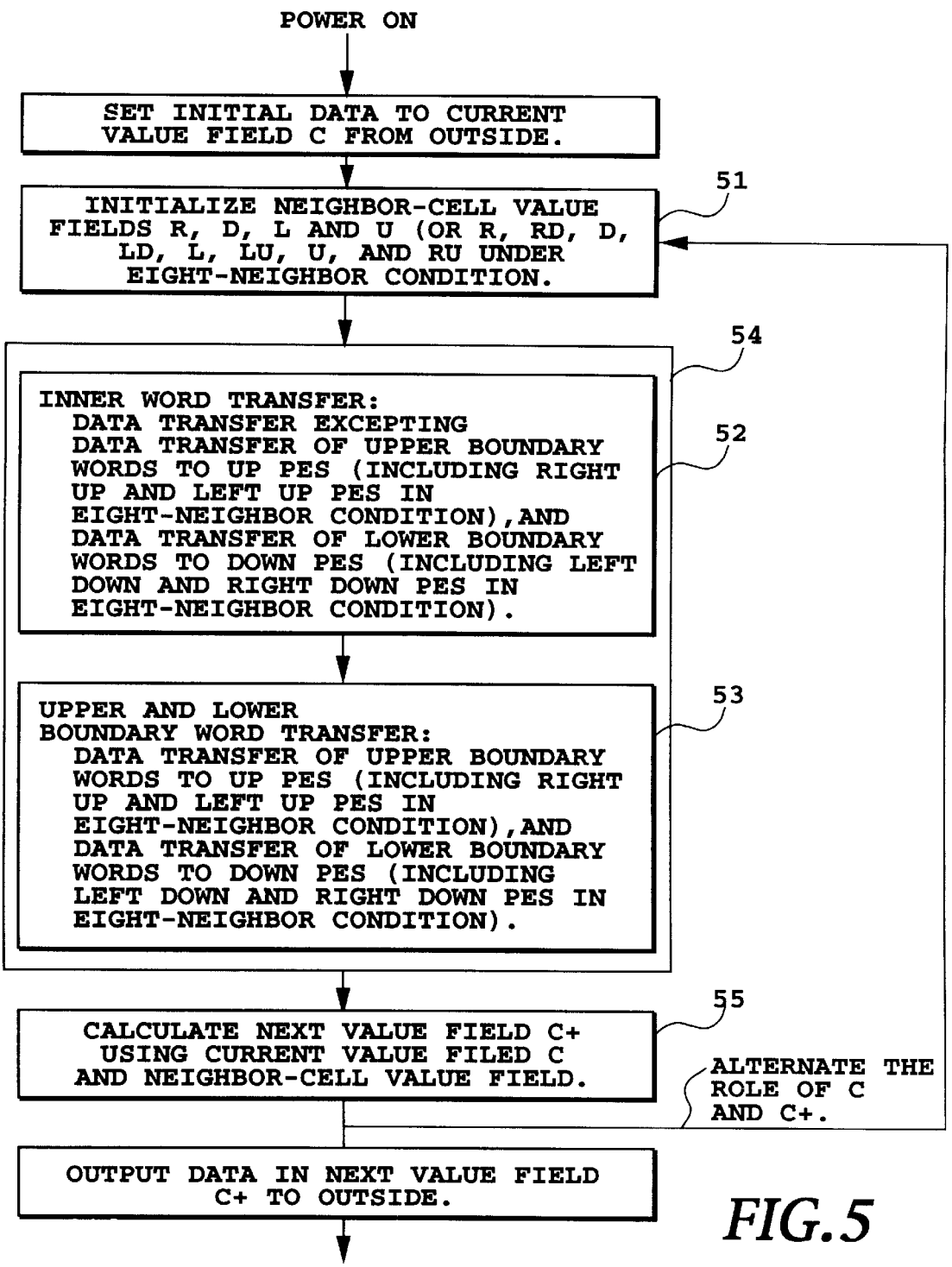
FIG. 5 is a flowchart illustrating the overall processing procedure in the two-dimensional PE array PEA1.

FIG. 5 is a flowchart illustrating the overall processing procedure of the two-dimensional PE array PEA1.

After the power supply is turned on, initial data from outside are set to the current value fields C 32 or 42.

Next, using the partial and parallel write function of the CAM $11_{(1,1)}$, all the neighbor-cell value fields in the two-dimensional PE array PEA1 are initialized to "0" (in block 51). The entire neighbor-cell value fields in the two-dimensional PE array PEA1 refer to, in the four-neighbor case, the right PE value field R 34, the down PE value field D 35, the left PE value field L 36, and the up PE value field U 37. On the other hand, they refer to, in the eight-neighbor case, the right PE value field R 44, the right down PE value field RD 45, the down PE value field D 46, the left down value field LD 47, the left PE value field L 48, the left up PE value field LU 49, the up PE value field U 410, and the right up value field RU 411.

Next, data transfer to the neighboring PEs is carried out (block 54). The data transfer is divided to inner word transfer (inter-CAM transfer: block 52) and upper and lower boundary word transfer (inter-CAM transfer: block 53). The inner word transfer (block 52) includes all the data transfer excepting the data transfer of upper boundary words 13 (see, FIG. 1) to their up PEs, and the transfer of lower boundary words 15 to their down PEs. The upper and lower boundary word transfer (block 53) is the data transfer of the upper boundary words 13 to their up PEs, and the data transfer of the lower boundary words 15 to their down PEs. The up PEs of the upper boundary words 13 include right up and left up PEs, and the down PEs include right down and left down PEs under eight-neighbor condition.

Next, the inner word transfer (block 52) in the present embodiment will be described.

Figure 6:
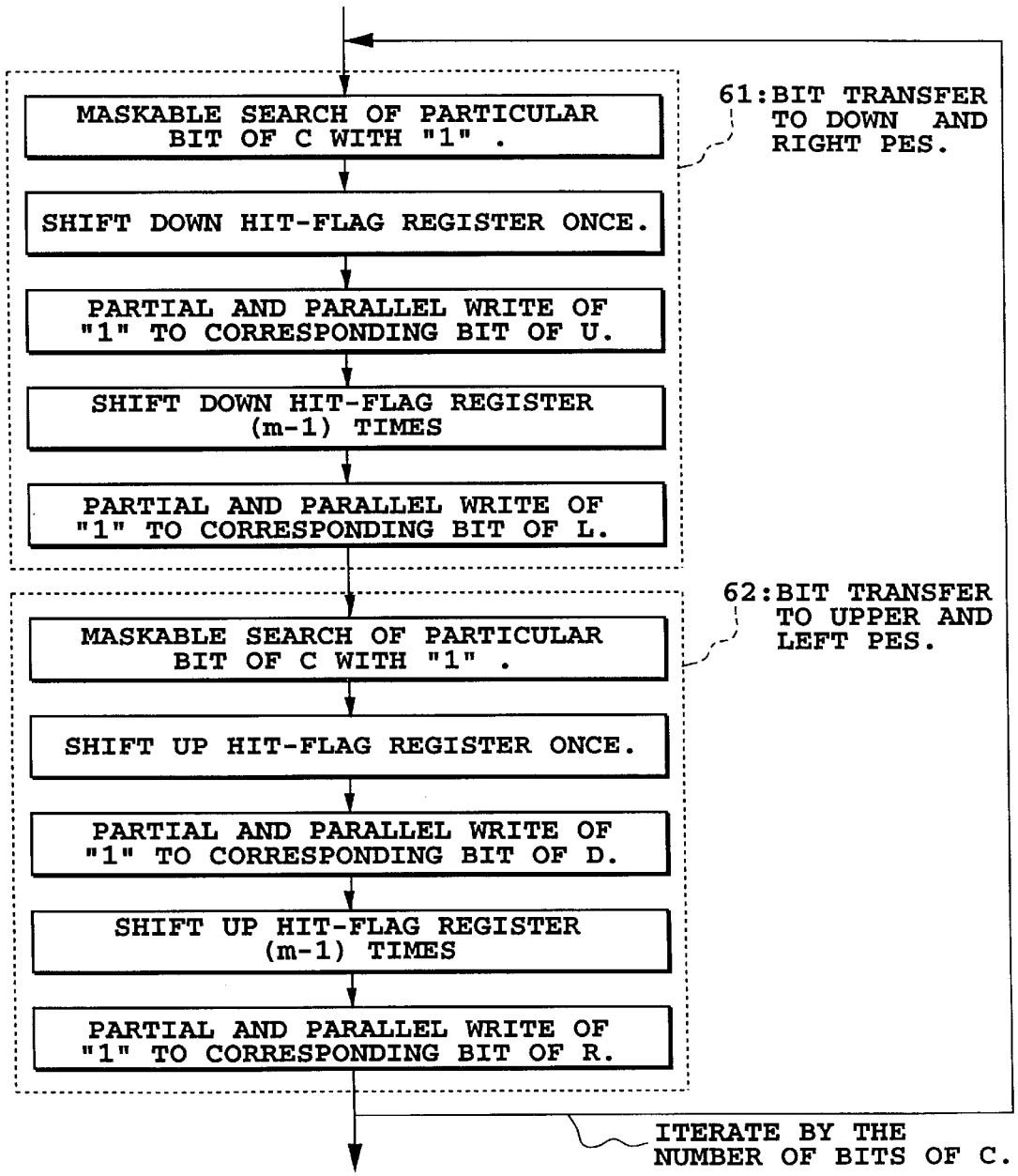
FIG. 6 is a flowchart illustrating the procedure of the four-neighbor inner word transfer in the embodiment.

FIG. 6 is a flowchart illustrating the procedure of the inner word transfer in the four-neighbor case in the present embodiment.

The four-neighbor inner word transfer (block 52) consists of two stages, bit transfer to the down and right PEs (block 61), and bit transfer to the up and left PEs (block 62).

In the down or right bit transfer (block 61), the content of a particular bit in C 32 is transferred to the hit-flag register 27 by setting in the mask register 22 masking data that masks bits other than the particular bit in C 32, and by carrying out the maskable search using "1". Then, the hit-flag register 27 is shifted down once. Subsequently, the partial and parallel write of "1" is carried out to the corresponding bit of U 37 of the words whose hit-flag register 27 is "1". Thus, the bit transfer to the down PEs is achieved. After that, the hit-flag register 27 is shifted down (m-1) times, and then the partial and parallel write of "1" is performed to the corresponding bit of L 36 of the words whose hit-flag register 27 is "1". Thus, the bit transfer to the right PEs is achieved.

In the up or left bit transfer (block 62), the content of a particular bit in C 32 is transferred to the hit-flag register 27 by setting in the mask register 22 masking data that masks bits other than the particular bit in C 32, and by carrying out the maskable search using "1". Then, the hit-flag register 27 is shifted up once. Subsequently, the partial and parallel write of "1" is carried out to the corresponding bit of D 35 of the words whose hit-flag register 27 is "1". Thus, the bit transfer to the up PEs is achieved. After that, the hit-flag register 27 is shifted up (m-1) times, and then the partial and parallel write of "1" is performed to the corresponding bit of R 34 of the words whose hit-flag register 27 is "1". Thus, the bit transfer to the left PEs is achieved.

The foregoing procedures are iterated by the number of bits of C 32 to complete the four-neighbor inner word transfer.

Figure 7A:
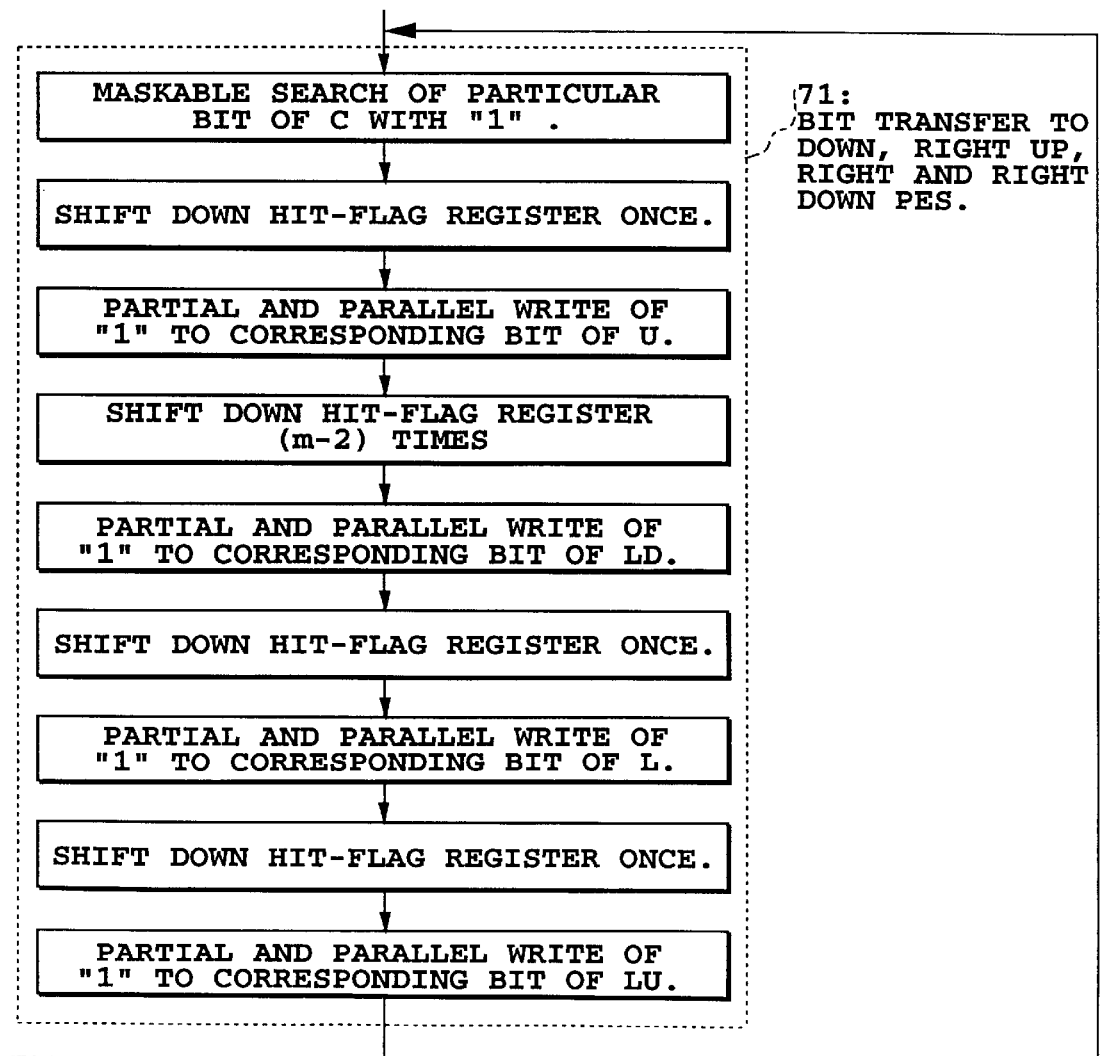
FIG. 7A is a flowchart illustrating the procedure of the eight-neighbor inner word transfer in the embodiment.
Figure 7B:
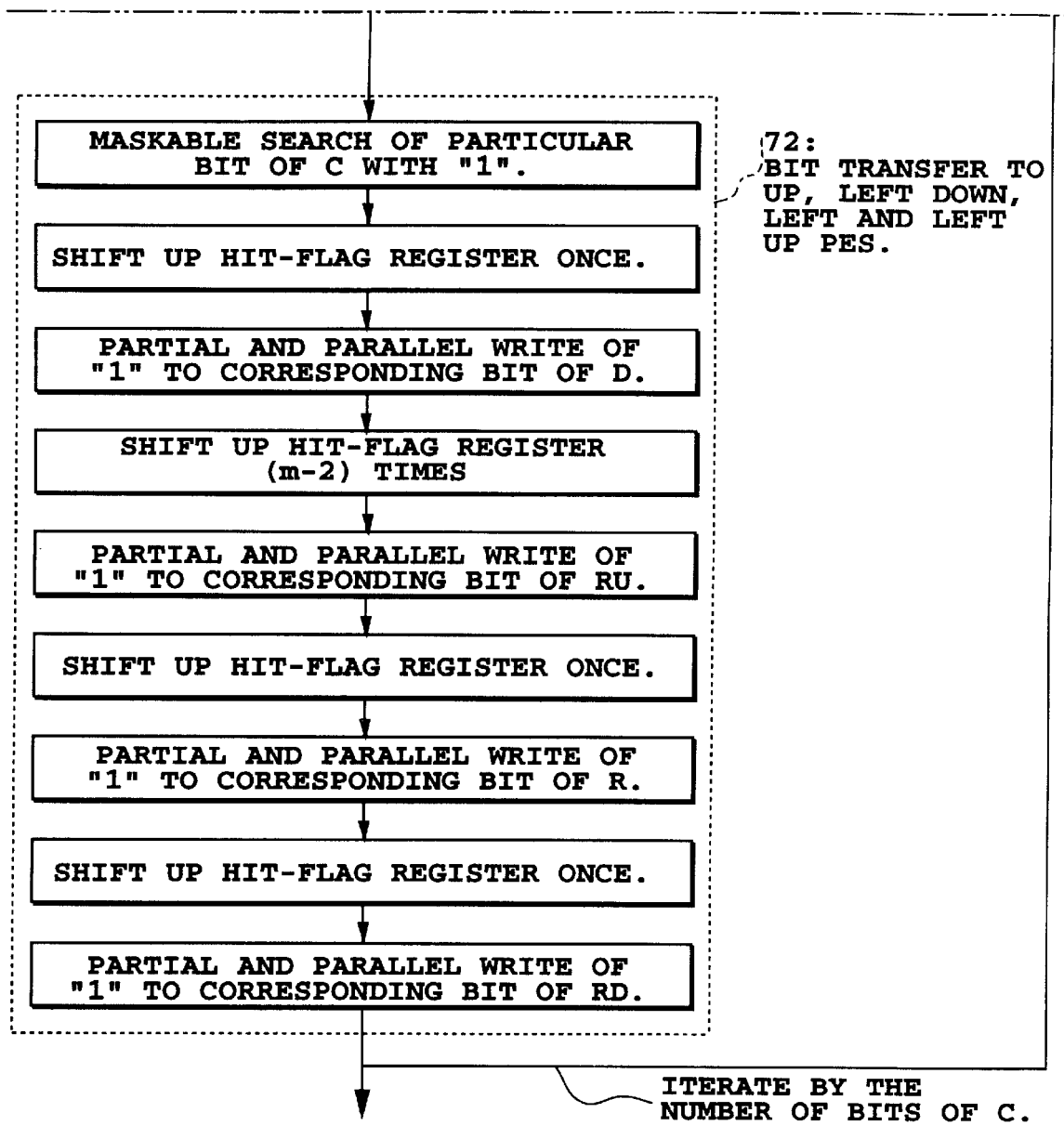
FIG. 7B is a flowchart illustrating the procedure of the eight-neighbor inner word transfer in the embodiment.

FIG. 7A and FIG. 7B are a flowchart illustrating the procedure of the inner word transfer in the eight-neighbor case in the present embodiment.

As shown in FIG. 7A and FIG. 7B, the eight-neighbor inner word transfer consists of two stages, a first stage of transferring a bit to the down, right up, right or right down PE (block 71), and a second stage of transferring a bit to the up, left down, left or left up PE (block 72).

In the bit transfer to the down, right up, right or right down PE (block 71), the content of a particular bit in C 42 is transferred to the hit-flag register 27 by setting in the mask register 22 masking data that masks bits other than the particular bit in C 42, and by carrying out the maskable search using "1". Then, the hit-flag register 27 is shifted down once. Subsequently, the partial and parallel write of "1" is carried out to the corresponding bit of U 410 of the words whose hit-flag register 27 is "1". Thus, the bit transfer to the down PEs is achieved. After that, the hit-flag register 27 is shifted down (m-2) times, and then the partial and parallel write of "1" is performed to the corresponding bit of LD 47 of the words whose hit-flag register 27 is "1". Thus, the bit transfer to the right up PEs is achieved.

Subsequently, the hit-flag register 27 is shifted down once, and then the partial and parallel write of "1" is carried out to the corresponding bit of L 48 of the words whose hit-flag register 27 is "1". Thus, the bit transfer to the right PEs is achieved. After that, the hit-flag register 27 is shifted down once, and then the partial and parallel write of "1" is performed to the corresponding bit of LU 49 of the words whose hit-flag register 27 is "1". Thus, the bit transfer to the right down PEs is achieved.

In the bit transfer to the up, left down, left or left up PE (block 72), the content of a particular bit in C 42 is transferred to the hit-flag register 27 by setting in the mask register 22 masking data that masks bits other than the particular bit in C 42, and by carrying out the maskable search using "1". Then, the hit-flag register 27 is shifted up once. Subsequently, the partial and parallel write of "1" is carried out to the corresponding bit of D 46 of the words whose hit-flag register 27 is "1". Thus, the bit transfer to the up PEs is achieved. After that, the hit-flag register 27 is shifted up (m-2) times, and then the partial and parallel write of "1" is performed to the corresponding bit of RU 411 of the words whose hit-flag register 27 is "1". Thus, the bit transfer to the left down PEs is achieved.

Subsequently, the hit-flag register 27 is shifted up once, and then the partial and parallel write of "1" is carried out to the corresponding bit of R 44 of the words whose hit-flag register 27 is "1". Thus, the bit transfer to the left PEs is achieved. After that, the hit-flag register 27 is shifted up once, and then the partial and parallel write of "1" is performed to the corresponding bit of RD 45 of the words whose hit-flag register 27 is "1". Thus, the bit transfer to the left up PEs is achieved. The foregoing procedures are iterated by the number of bits of C 42 to complete the eight-neighbor inner word transfer in its entirety. The 24 or more neighbor inner word transfer can be achieved in the same manner as that of the four- or eight-neighbor inner word transfer.

The upper and lower boundary word transfer (block 53) is successively carried out by using data write and data read to and from the word using the address to the CAM $11_{(1,1)}$ after completing the inner word transfer (block 52). Although non-corresponding data are written, for example, into U 37 in the upper boundary words 13, this presents no problem since the non-corresponding data is overwritten during the upper and down boundary word transfer (block 53) in the flowchart as shown in FIG. 5.

Subsequently, the next values are calculated by using the current value field C 32 or 42 and the neighbor-cell values (block 55). The next values are entered into the next value field C+ 33 or 43. The processing can be performed simultaneously on the entire words in the CAM $11_{(1,1)}$. Then, after exchanging the role of the next value field C+ 32 or 42 and the role of the current value field C 33 or 43, the processing is returned to the step of initialization (block 51). After iterating the above procedures by arbitrary times, the data in the next value field C+ 33 or 43 is output to outside.

Figure 29:
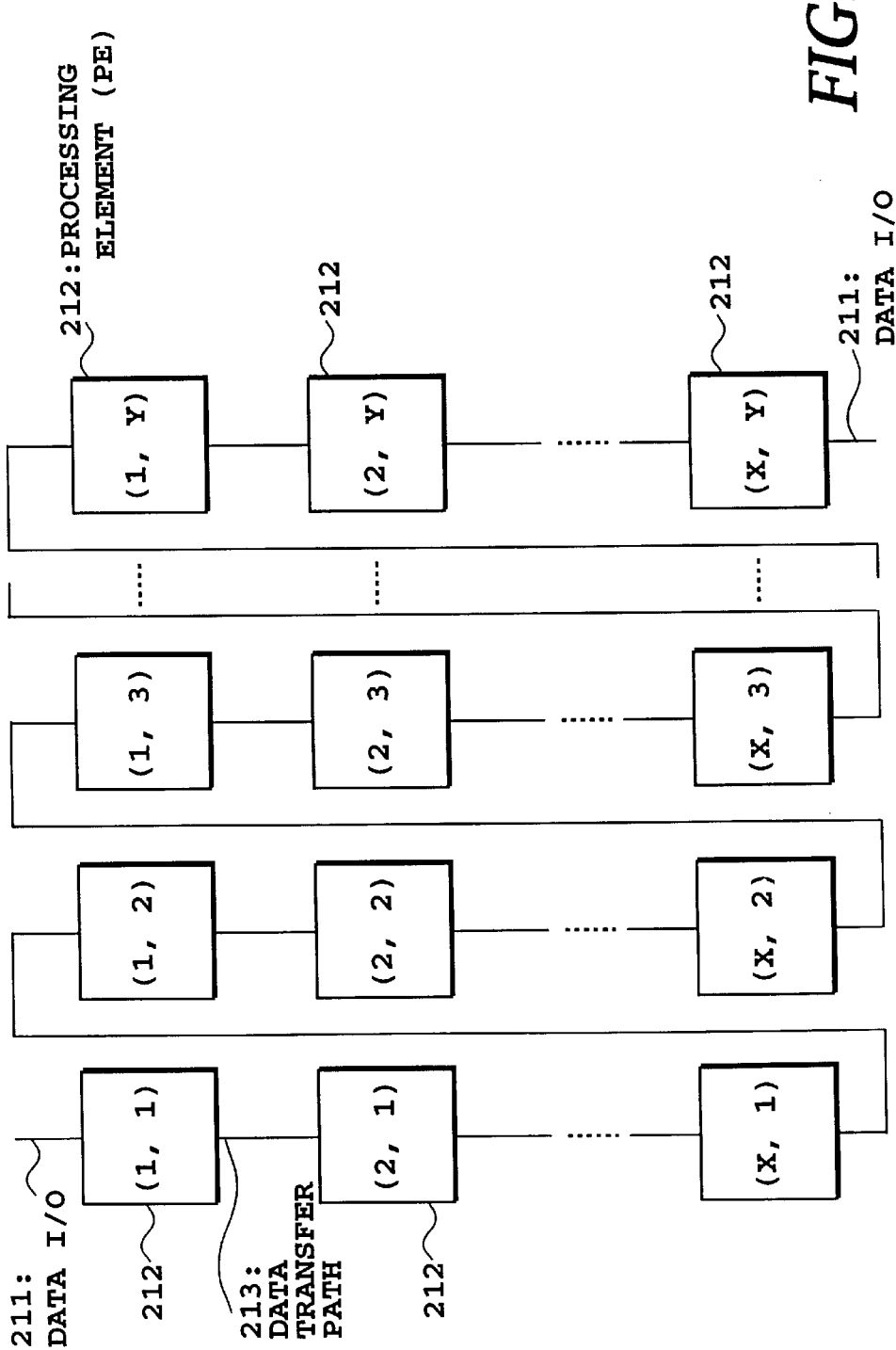
FIG. 29 is a block diagram showing a conventional two-dimensional PE array PEA12.
Figure 30:
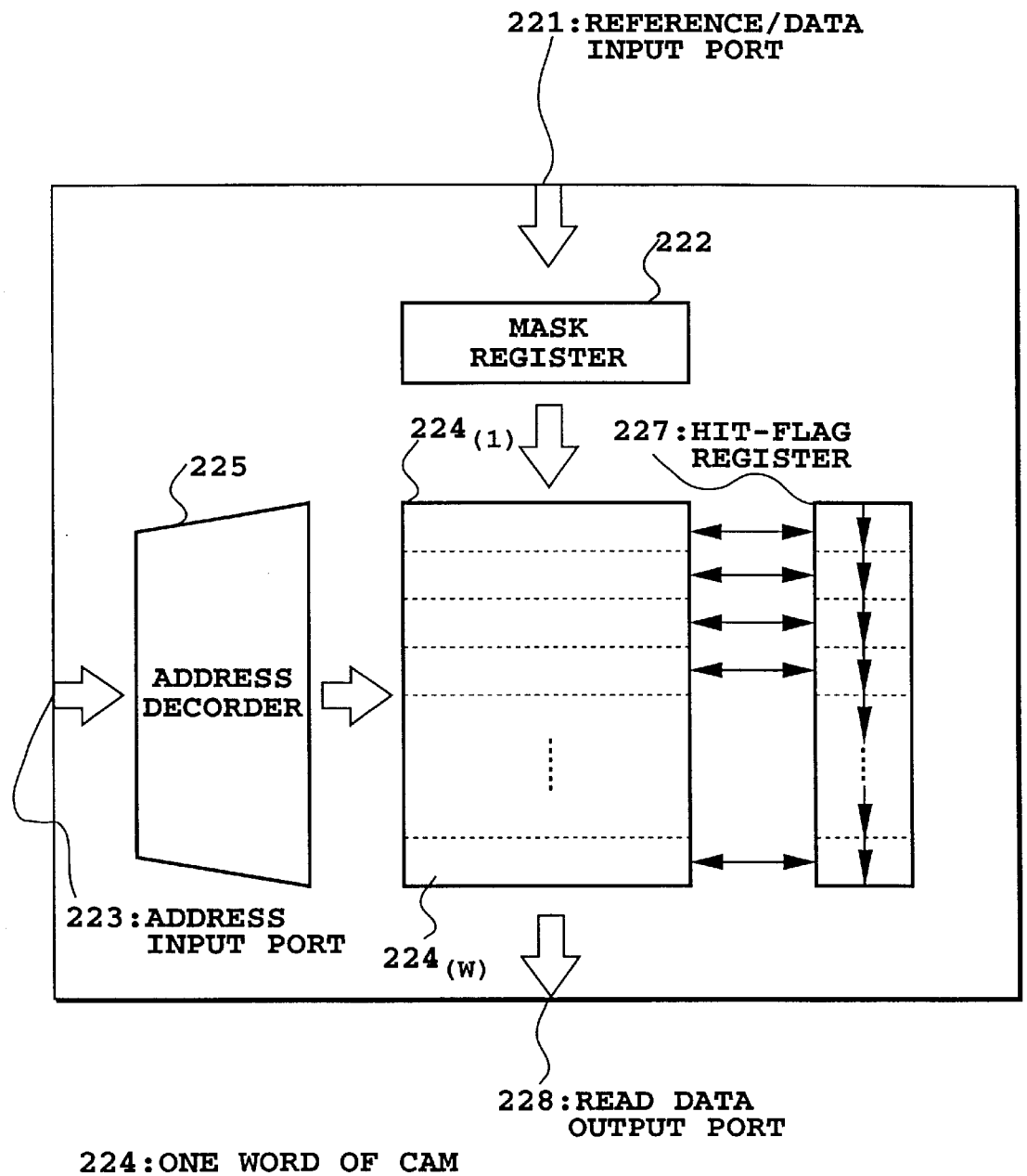
FIG. 30 is a block diagram showing a conventional CAM M11.
Figure 31:
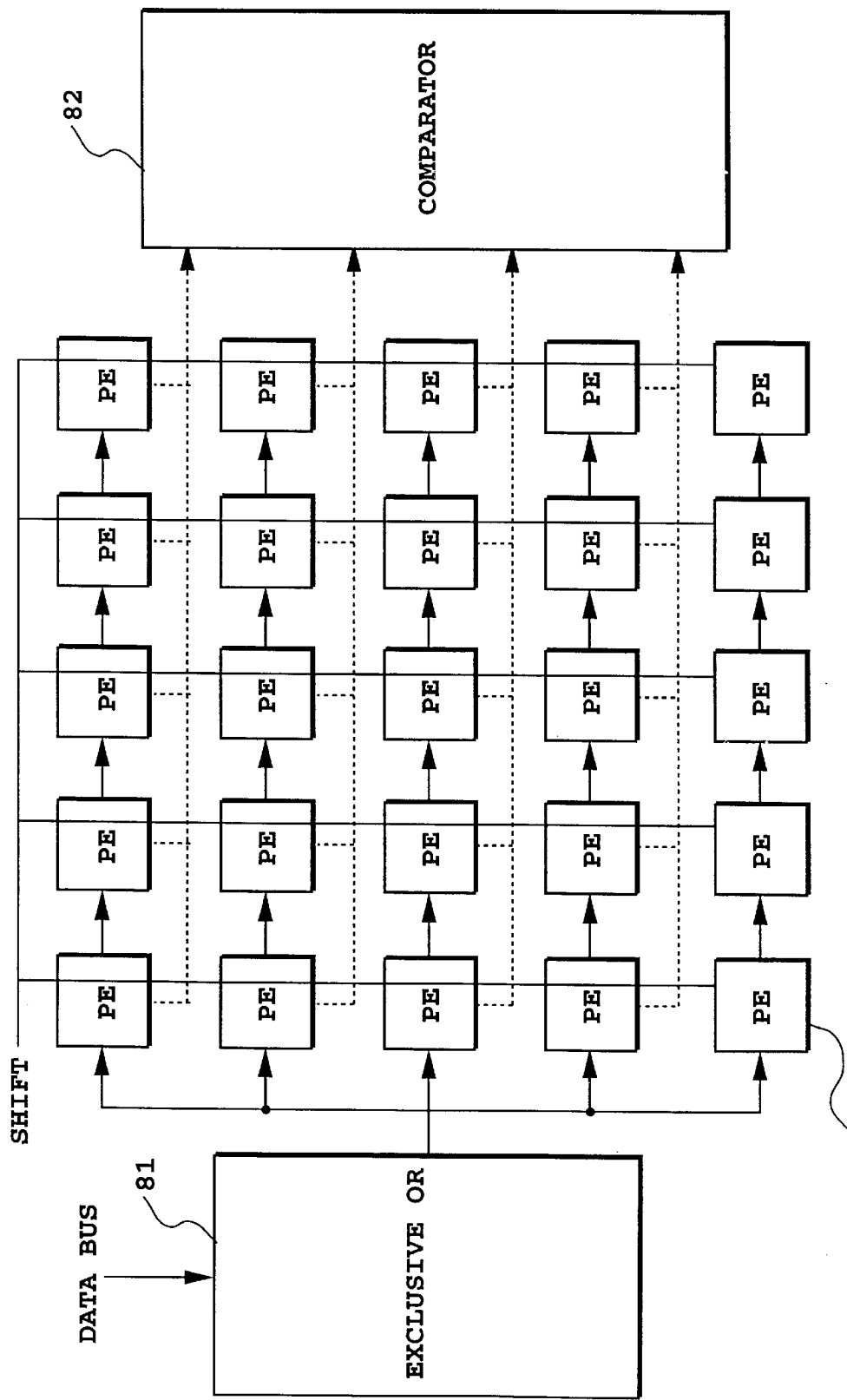
FIG. 31 is a block diagram showing a conventional mathematical morphology processor.

In this embodiment, each PE and data transfer path can be implemented with a small amount of hardware, since the CAM $11_{(1,1)}$ is arranged using the very large scale integration memory technique. Accordingly, the two-dimensional PE array PEA1 can be implemented with a small amount of hardware. Furthermore, since multiple-zigzag mapping is taken in which PEs are divided by every Y/q block in implementing two-dimensional PE array PEA1 including X×Y PEs, it becomes possible to shorten the data transfer time between the PEs in the horizontal direction as compared with the conventional two-dimensional PE array PEA12 in which the PEs are mapped in zigzag by every Y elements as shown in FIG. 29.

Although the word transfer is necessary between the CAMs in the vertical direction in this embodiment, the efficiency of the word transfer is improved since it employs the CAM 11 which can directly read or write data from or into the words. This also serves to shorten the total data transfer time of the two-dimensional PE array PEA1. In addition, since the number of words to be mapped in zigzag, and the numbers q and r of CAMs 11 in the horizontal and vertical directions can be selected freely in the two-dimensional PE array PEA1, the two-dimensional PE array PEA1 can be configured using any desired number of PEs, which serves to implement a flexible two-dimensional PE array.

EMBODIMENT 2

Figure 8:
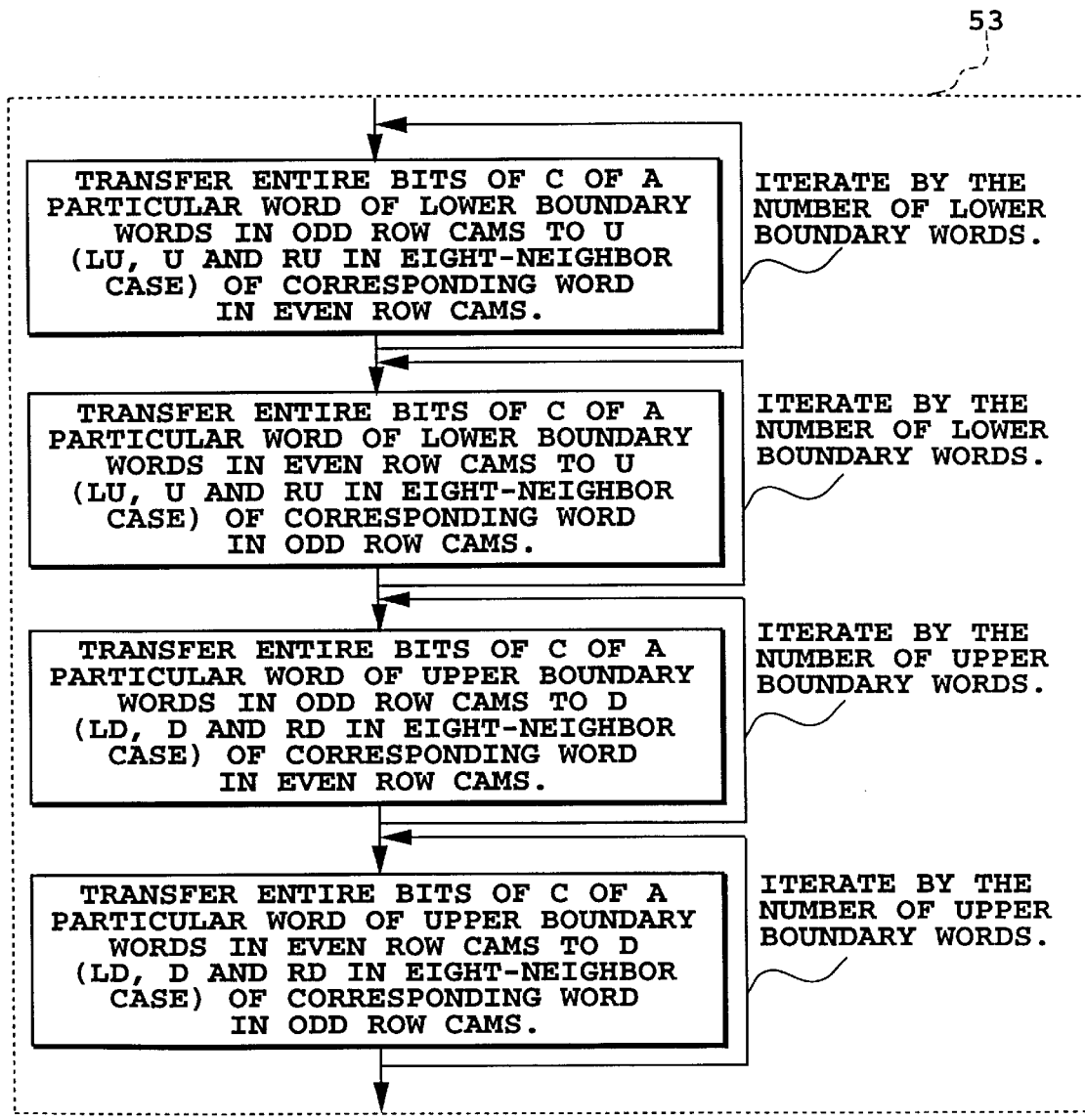
FIG. 8 is a flowchart illustrating an upper and lower boundary word transfer procedure 53 in a second embodiment in accordance with the present invention.

FIG. 8 is a flowchart illustrating the upper and lower boundary word transfer procedure 53 in the second embodiment in accordance with the present invention.

Figure 9:
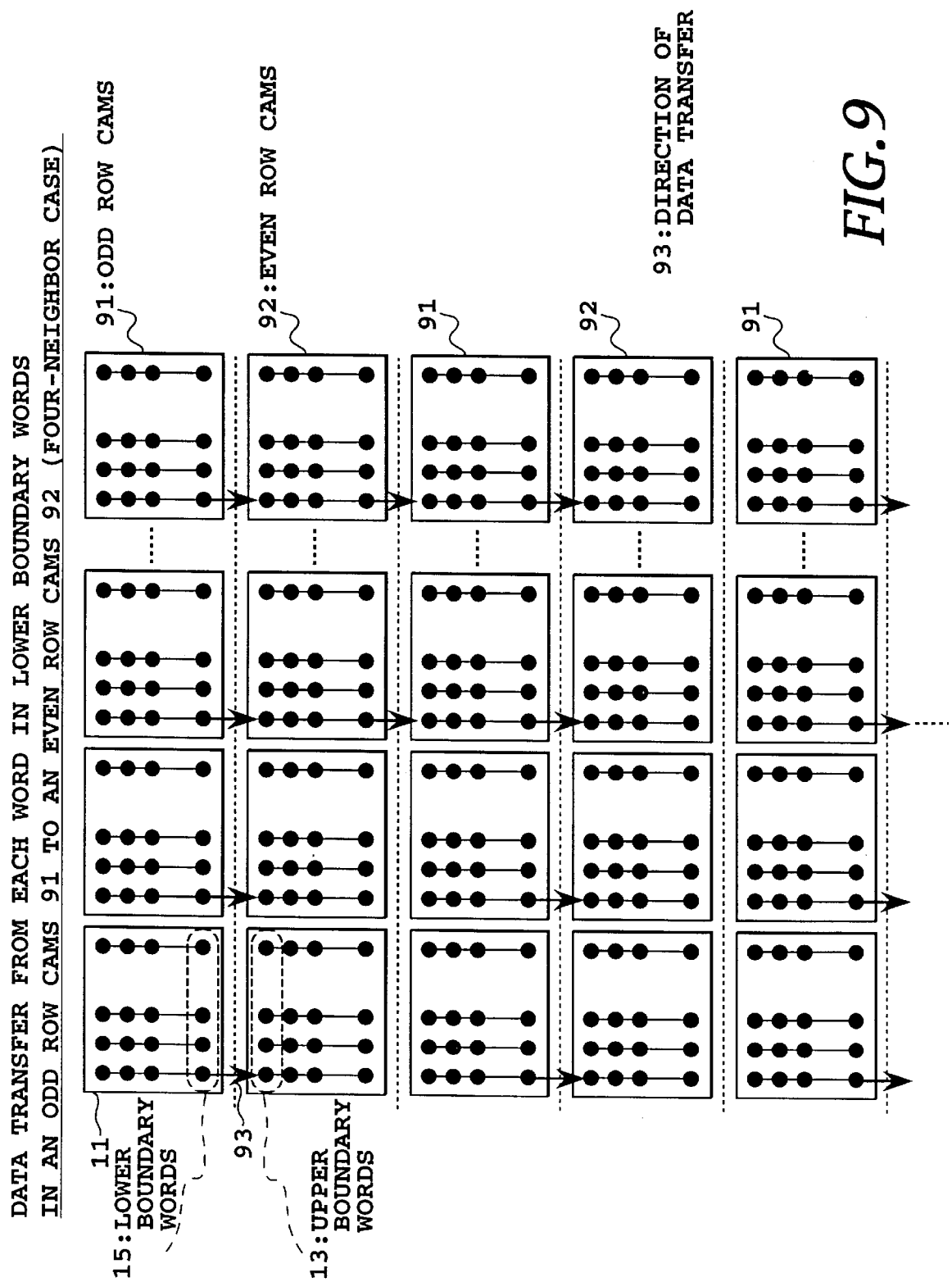
FIG. 9 is a block diagram illustrating an example in which each word in lower boundary words 15 in odd row CAMs 91 is transferred to even row CAMs 92 in the four-neighbor condition in the second embodiment.

FIG. 9 is a block diagram showing an example in which each word in lower boundary words 15 in an odd row CAMs 91 is transferred to an even row CAMs 92 in the four-neighbor case in the second embodiment. The CAMs constituting the odd row CAMs 91 and even row CAMs 92 are the same as the CAM $11_{(1,1)}$.

Figure 10:
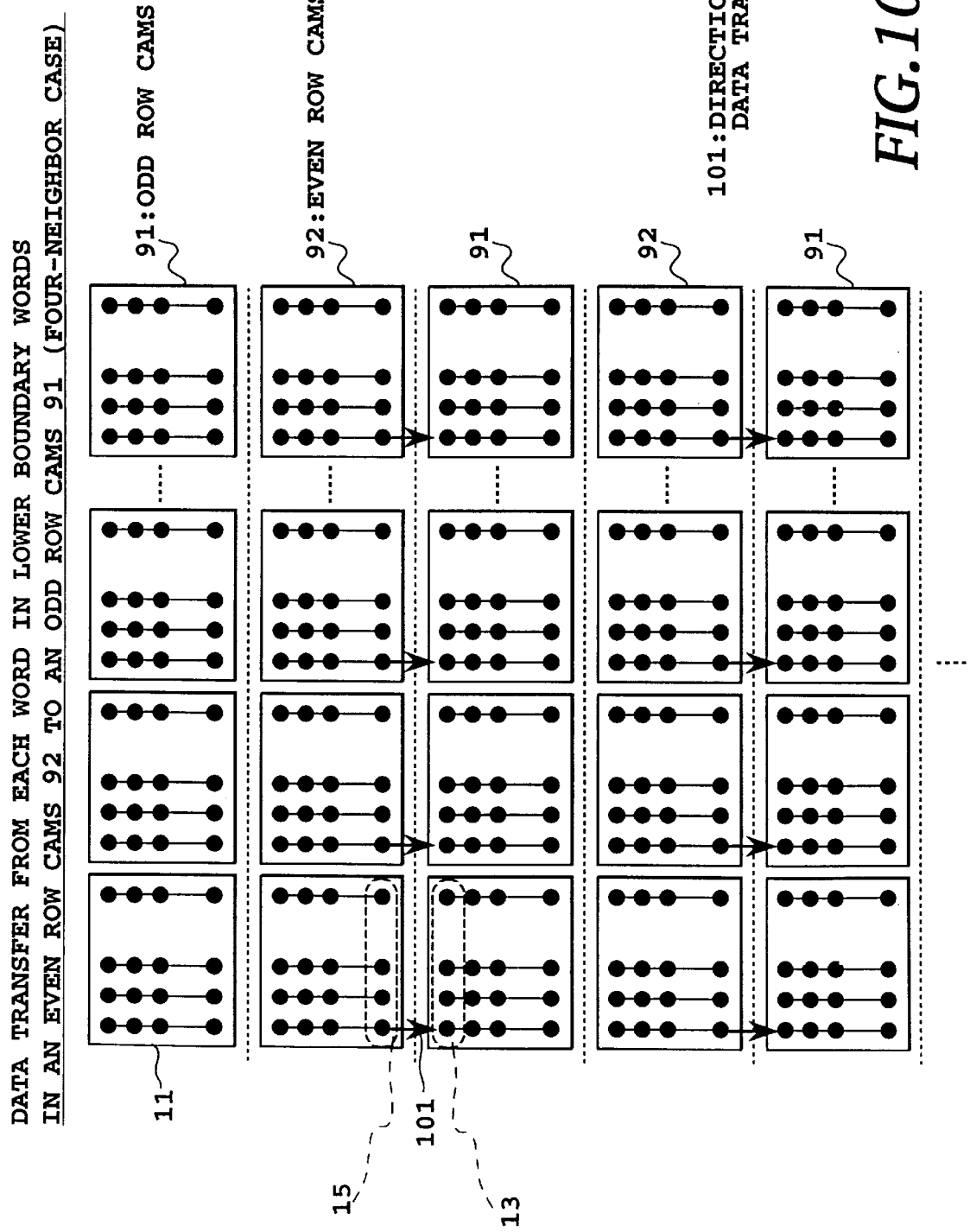
FIG. 10 is a block diagram illustrating an example in which each word in lower boundary words 15 in even row CAMs 92 is transferred to odd row CAMs 91 in the four-neighbor condition in the second embodiment.

FIG. 10 is a block diagram showing an example in which each word in the lower boundary words 15 in the even row CAMs 92 is transferred to the odd row CAMs 91 in the four-neighbor case in the second embodiment.

Figure 11:
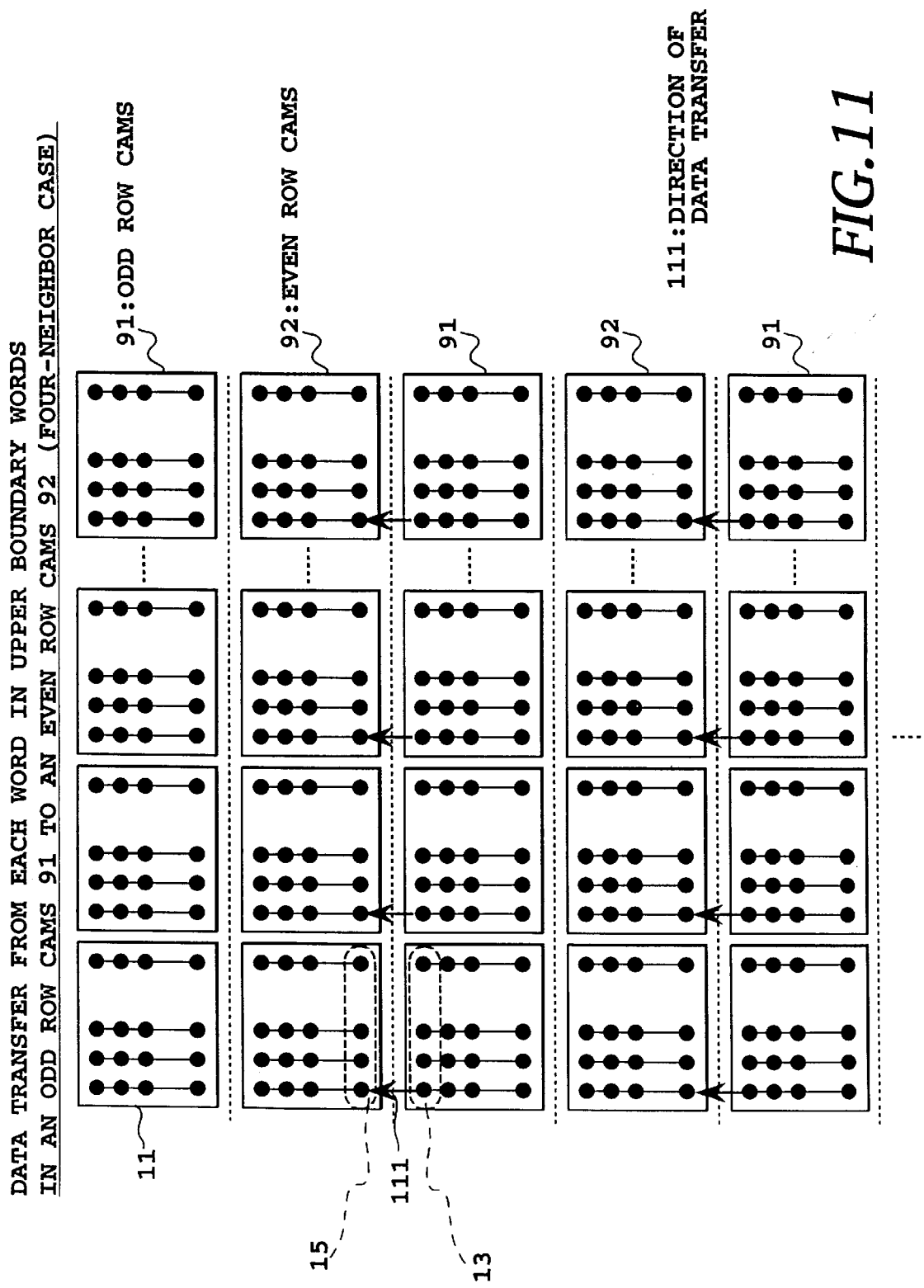
FIG. 11 is a block diagram illustrating an example in which each word in upper boundary words 13 in odd row CAMs 91 is transferred to even row CAMs 92 in the four-neighbor condition in the second embodiment.

FIG. 11 is a block diagram showing an example in which each word in upper boundary words 13 in the odd row CAMs 91 is transferred to the even row CAMs 92 in the four-neighbor case in the second embodiment.

Figure 12:
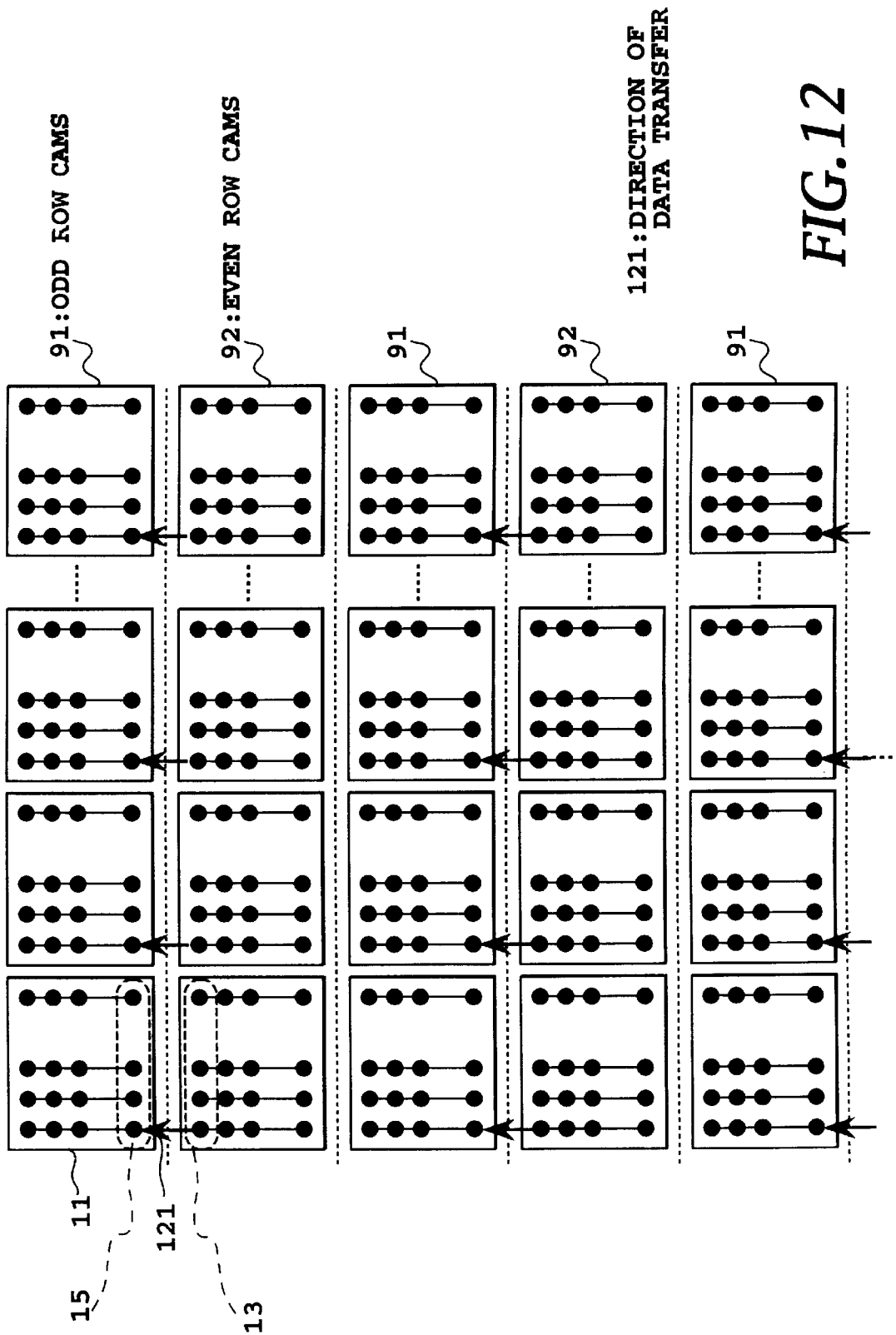
FIG. 12 is a block diagram illustrating an example in which each word in upper boundary words 13 in even row CAMs 92 is transferred to odd row CAMs 91 in the four-neighbor condition in the second embodiment.

FIG. 12 is a block diagram showing an example in which each word in the upper boundary words 13 in the even row CAMs 92 is transferred to the odd row CAMs 91 in the four-neighbor case in the second embodiment.

In the upper and lower boundary word transfer procedure (block 53) as shown in FIG. 8, first, the entire bits of the current value field C 32 or 42 of a particular word in the lower boundary words 15 of the odd row CAMs 91 are transferred to U 37 (to LU 49, U 410, and RU 411 in the eight-neighbor case) of the corresponding word in the upper boundary words 13 in the even row CAMs 92. In this case, all the data transfer in the direction 93 is carried out simultaneously as shown in FIG. 9. This procedure is iterated sequentially by the number of the lower boundary words 15.

Subsequently, the entire bits of the current value field C 32 or 42 of a particular word in the lower boundary words 15 of the even row CAMs 92 are transferred to U 37 (to LU 49, U 410, and RU 411 in the eight-neighbor case) of the corresponding word in the upper boundary words 13 in the odd row CAMs 91. In this case, all the data transfer in the direction 101 is carried out simultaneously as shown in FIG. 10. This procedure is iterated sequentially by the number of the lower boundary words 15.

After that, the entire bits of the current value field C 32 or 42 of a particular word in the upper boundary words 13 of the odd row CAMs 91 are transferred to D 35 (to LD 47, D 46, and RD 45 in the eight-neighbor case) of the corresponding word in the lower boundary words 15 in the even row CAMs 92. In this case, all the data transfer in the direction 111 is carried out simultaneously as shown in FIG. 11. This procedure is iterated sequentially by the number of the upper boundary words 13.

Subsequently, the entire bits of the current value field C 32 or 42 of a particular word belonging to the upper boundary words 13 of the even row CAMs 92 are transferred to D 35 (to LD 47, D 46, and RD 45 in the eight-neighbor case) of the corresponding word in the lower boundary words 15 in the odd row CAMs 91. In this case, all the data transfer in the direction 121 is carried out simultaneously as shown in FIG. 12. This procedure is iterated sequentially by the number of the upper boundary words 13.

With these procedures, the entire upper and lower boundary word transfer (block 53) is achieved. In the second embodiment, since the data transfer is carried out in parallel by the number of arrows as shown in FIGS. 9–12, the transfer time is further shortened as compared with the sequential data transfer in the PEA1 as shown in FIG. 1.

In other words, the second embodiment provides the following data transfer method in q×r CAMs, where q and r are any integer equal to or greater than two, each including one-dimensionally arranged w words (w is any natural number), a hit-flag register capable of shift up and shift down, and an upper shift I/O port and lower shift I/O port for inputting from or outputting from outside the contents of the hit-flag register: the data transfer method comprising the steps of carrying out simultaneous data transfer from the odd row CAMs to the even row CAMs, or from the even row CAMs to the odd row CAMs in the CAMs arranged in q rows in the vertical direction, and of carrying out the above mentioned simultaneous data transfer in the CAMs arranged in r columns in the horizontal direction.

Adopting such a data transfer method enables the respective CAMs to operate independently of each other, which makes it possible between the CAMs 11 the simultaneous data transfer from the odd row CAMs 91 to the even row CAMs 92, from the even row CAMs 92 to the odd row CAMs 91, or in the entire CAMs arranged in the horizontal direction, thereby further shortening the data transfer time.

EMBODIMENT 3

Figure 13:
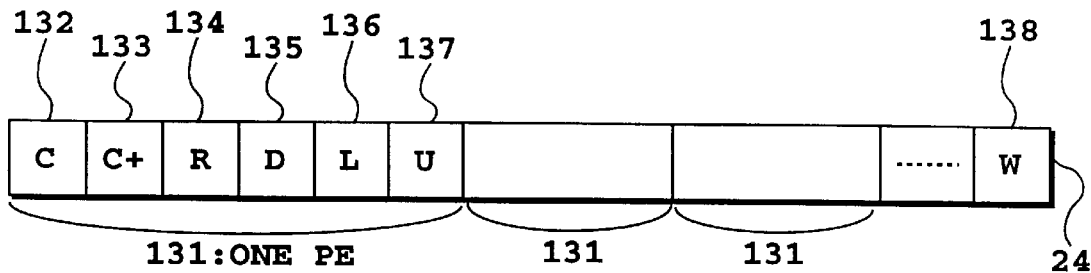
FIG. 13 is a diagram illustrating the mapping of words 24 of the CAM 11 to PEs when data transfer is carried out to the four neighboring PEs in a third embodiment in accordance with the present invention.

FIG. 13 is a diagram illustrating the mapping of the words 24 of the CAM 11 to the PEs in a third embodiment of a two-dimensional PE array PEA3 in accordance with the present invention (in the four-neighbor case).

Figure 20:
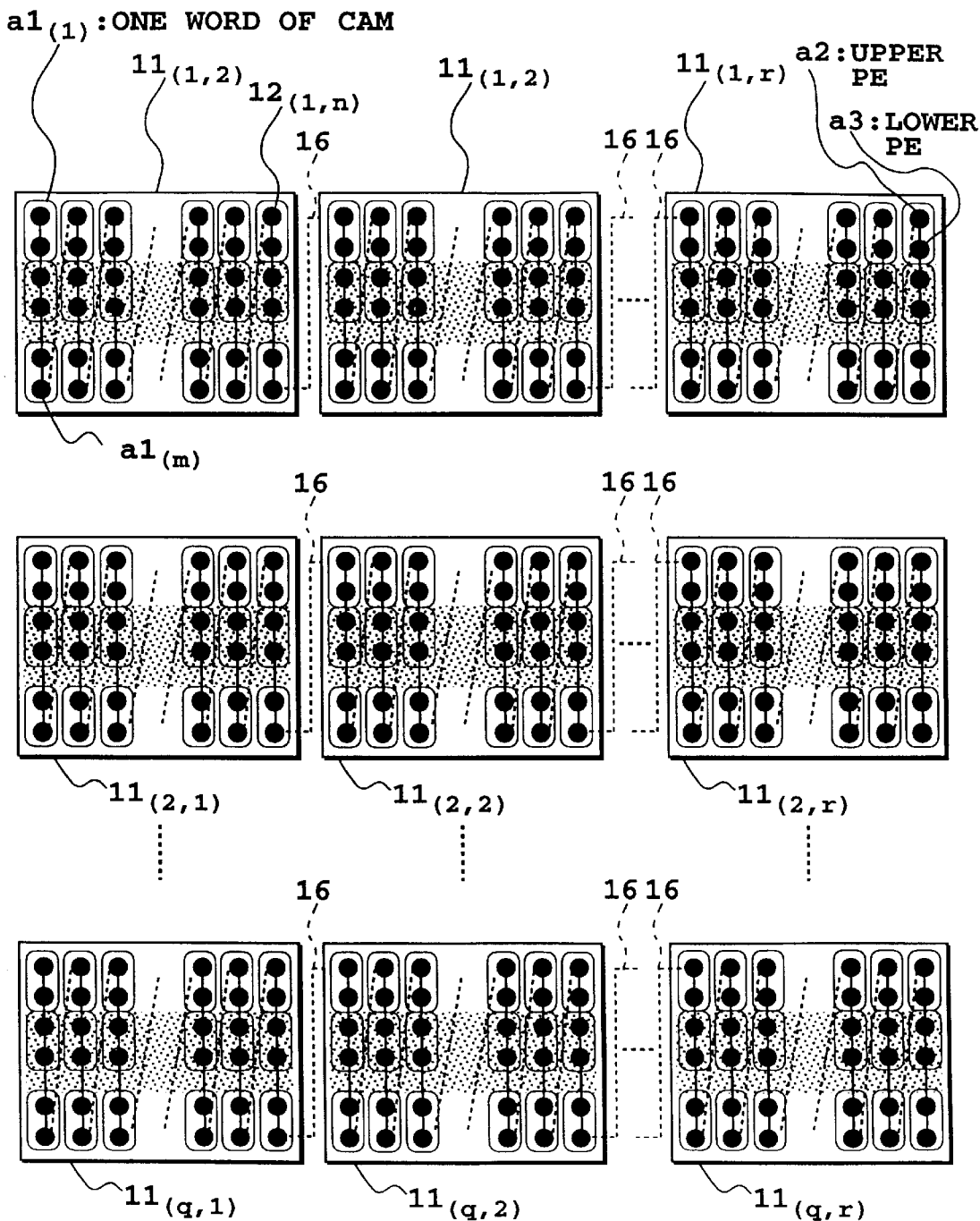
FIG. 20 is a block diagram showing a configuration of a two-dimensional PE array with two PEs being assigned to each word 24 of the CAMs 11.
Figures 21, 21A:
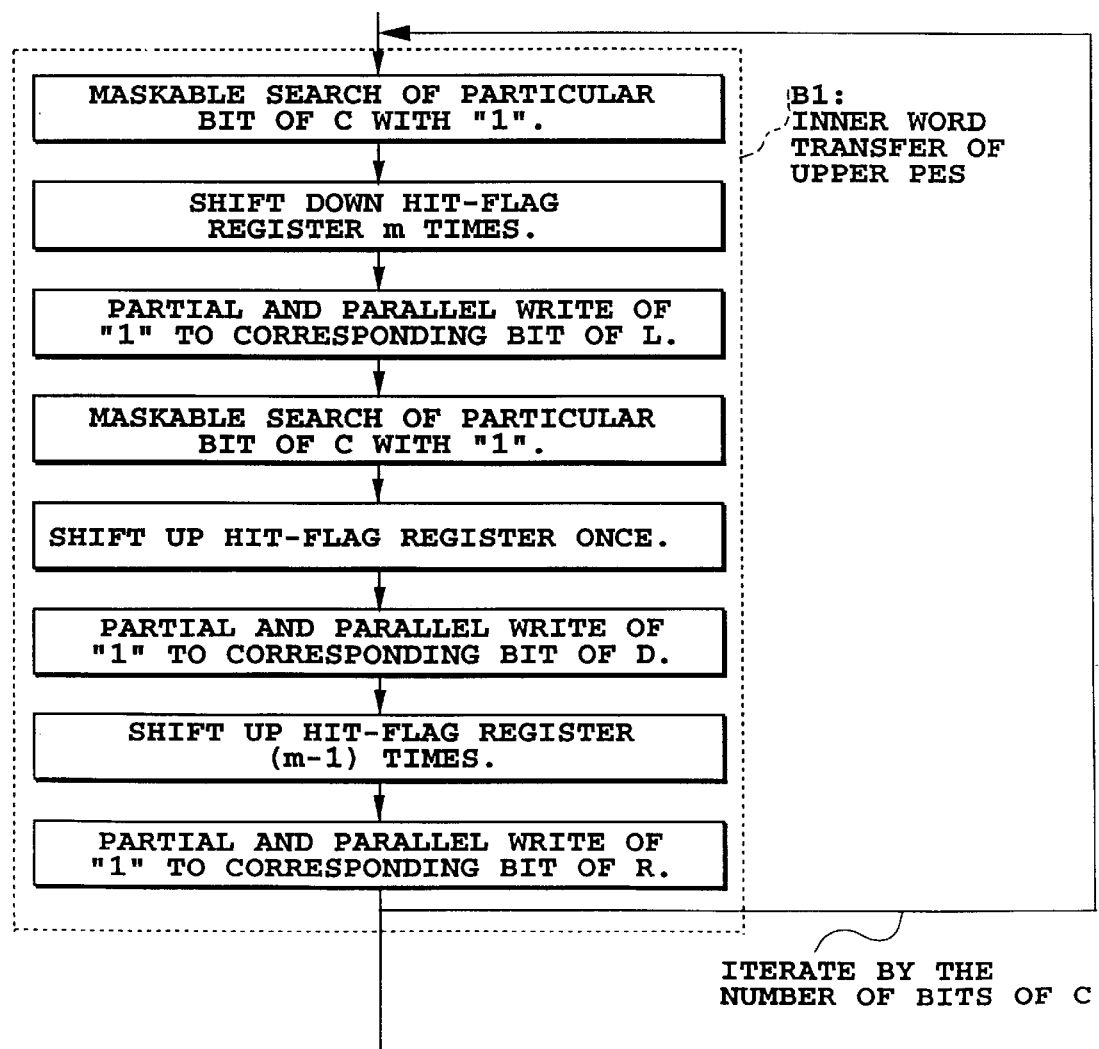
FIG. 21 is a diagram illustrating the relationship between FIG. 21A and FIG. 21B.
FIG. 21A is a flowchart illustrating an inner word transfer procedure (block 52) to the four-neighboring PEs when the two PEs are assigned to each word 24 of the CAMs 11.
Figure 21B:
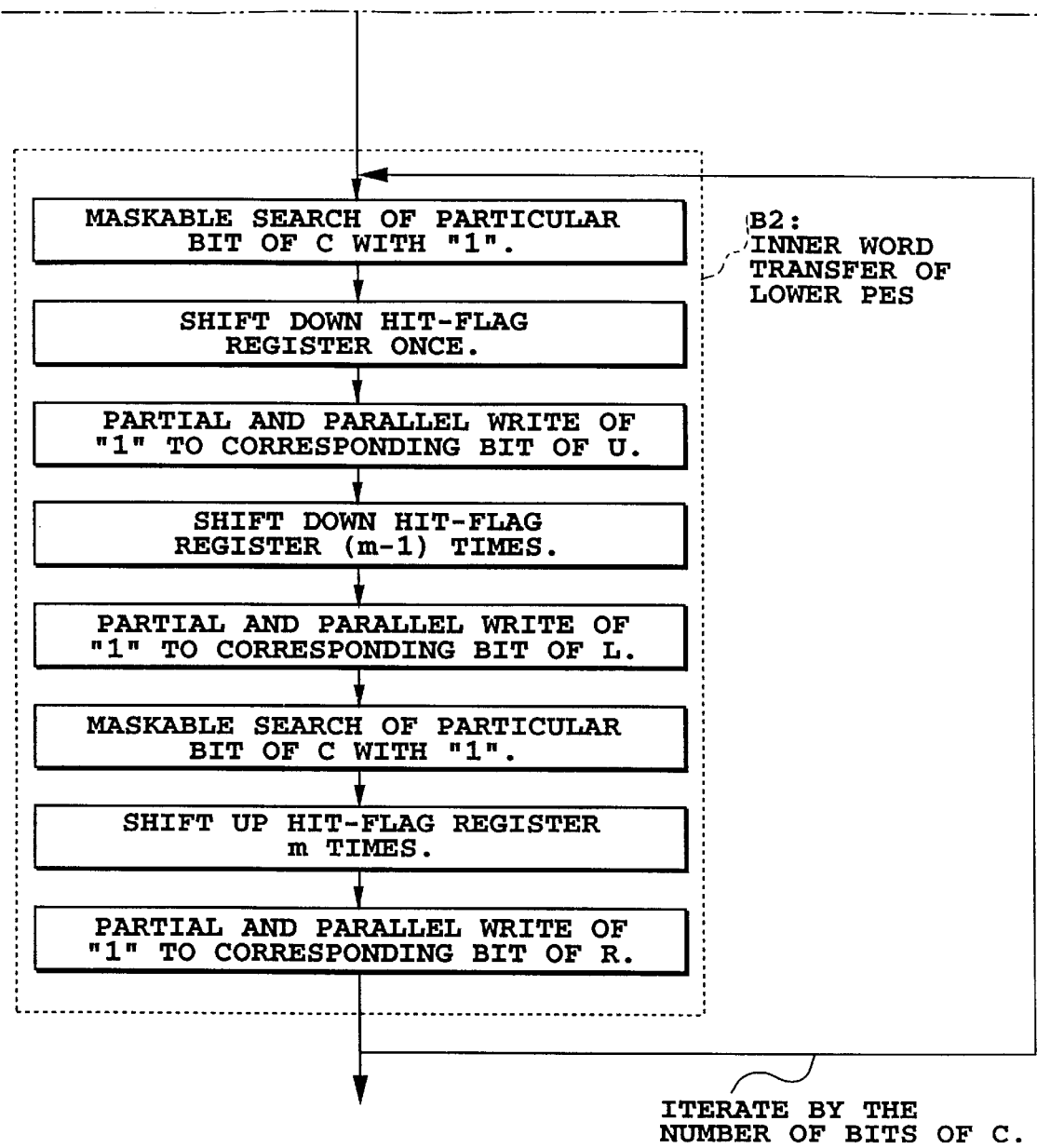
FIG. 21B is a flowchart illustrating an inner word transfer procedure (block 52) to the four-neighboring PEs when the two PEs are assigned to each word 24 of the CAMs 11.

FIG. 20 is a block diagram illustrating a configuration of the two-dimensional PE array in the case where two PEs are assigned to each one of the words 24 of the CAM 11.

As shown in FIG. 13, a PE 131 includes a current value field C 132, a next value field C+ 133, a right PE value field R 134, a down PE value field D 135, a left PE value field L 136, and an up PE value field U 137. A set of J PEs 131 is mapped to each word of the words 24 of the CAMs 11, where J is a natural number equal to or greater than two, and is determined such that it takes the maximum value within the allowable bit number.

Assuming that J is two in this case, two PEs, an upper PE a2 and a lower PE a3 are assigned to one word a1 as shown in FIG. 20, so that a two-dimensional PE array can be implemented which includes X=2×m×q PEs in the vertical direction, and Y=n×r PEs in the horizontal direction. The down PE value field D 135 of the upper PE a2, and the up PE value field U 137 of the lower PE a3 are not provided since these data are present on the same word.

The word mapping of the CAMs is implemented in the same manner in the eight-neighbor or 24-neighbor cases. Such arrangement can include greater number of PEs in the same number of CAMs, thereby implementing a two-dimensional PE array with a smaller amount of hardware.

Next, the overall processing procedures for various types of processings using the two-dimensional PE array PEA3 will be described.

The processing procedures are the same as those in FIG. 6 excepting the inner word transfer (block 52) and the upper and lower boundary word transfer (block 53).

The inner word transfer (block 52) is carried out in this embodiment through two stages, the inner word transfer b1 of the upper PE a2, and the inner word transfer b2 of the lower PE a3.

In the inner word transfer b1 of the upper PE a2, the content of a particular bit of C 32 is transferred to the hit-flag register 27 by setting in the mask register 22 masking data that masks bits other than the particular bit, and by carrying out the maskable search using "1". Subsequently, the hit-flag register 27 is shifted down m times, and then the partial and parallel write of "1" is carried out to the corresponding bit of L 36 of the words whose hit-flag register 27 is "1". Thus, the bit transfer to the right PEs is achieved.

After that, the content of a particular bit of C 32 is transferred to the hit-flag register 27 by setting again in the mask register 22 masking data that masks bits other than the particular bit, and by carrying out the maskable search using "1". Subsequently, the hit-flag register 27 is shifted up once. Then, the partial and parallel write of "1" is carried out to the corresponding bit of D 35 of the words whose hit-flag register 27 is "1". Thus, the bit transfer to the up PEs is achieved.

Subsequently, the hit-flag register 27 is shifted up (m-1) times, and then the partial and parallel write of "1" is carried out to the corresponding bit of R 34 of the words whose hit-flag register 27 is "1". Thus, the bit transfer to the left PEs is achieved. The foregoing procedures are iterated by the number of bits of C 32. Thus, the four-neighbor inner word transfer of PE a2 has been completed.

In the inner word transfer b2 of the lower PE a3, the content of a particular bit of C 32 is transferred to the hit-flag register 27 by setting in the mask register 22 masking data that masks bits other than the particular bit, and by carrying out the maskable search using "1". Subsequently, the hit-flag register 27 is shifted down once, and then the partial and parallel write of "1" is carried out to the corresponding bit of U 37 of the words whose hit-flag register 27 is "1". Thus, the bit transfer to the down PEs is achieved.

Subsequently, the hit-flag register 27 is shifted down (m-1) times. Then, the partial and parallel write of "1" is carried out to the corresponding bit of L 36 of the words whose hit-flag register 27 is "1". Thus, the bit transfer to the right PEs is achieved.

After that, the content of a particular bit of C 32 is transferred to the hit-flag register 27 by setting again in the mask register 22 masking data that masks bits other than the particular bit, and by carrying out the maskable search using "1". Subsequently, the hit-flag register 27 is shifted UP m times. Then, the partial and parallel write of "1" is carried out to the corresponding bit of R 34 of the words whose hit-flag register 27 is "1". Thus, the bit transfer to the left PEs is achieved. The foregoing procedures are iterated by the number of bits of C 32. Thus, the four-neighbor inner word transfer of PE a3 has been completed.

Next, the upper or lower boundary word transfer procedure (block 53) will be described.

The upper or lower boundary word transfer 50 is achieved in a procedure similar to that shown in FIG. 8: a particular word of each of the lower boundary words 15 in the odd row CAMs 91 (see, FIGS. 9–12) is transferred to the even row CAMs 92; a particular word of each of the lower boundary words 15 in the even row CAMs 92 is transferred to the odd row CAMs 91; a particular word of each of the upper boundary words 13 in the odd row CAMs 91 is transferred to the even row CAMs 92; a particular word of each of the upper boundary words 13 in the even row CAMs 92 is transferred to the odd row CAMs 91; and the foregoing procedures are iterated by the number of words in the upper and lower boundary words to complete the transfer.

In the present embodiment, however, two PEs are assigned to each word 24 of the CAMs 11 as shown in FIG. 20. Taking account of this, only the words of the upper PEs a2 are transferred in the word transfer from the upper boundary words 13 to the lower boundary words 15, and only the words of the lower PEs a3 are transferred in the word transfer from the lower boundary words 15 to the upper boundary words 13. By the foregoing procedures, the upper and lower boundary word transfer (block 53) has been completed in its entirety.

FIG. 13 is a diagram illustrating the mapping of the words 24 of the CAM 11 to the PEs of a two-dimensional PE array PEA3 (in the four-neighbor case).

As shown in FIG. 13, a PE 131 includes a current value field C 132, a next value field C+ 133, a right PE value field R 134, a down PE value field D 135, a left PE value field L 136, and an up PE value field U 137. A set of J PEs 131 is assigned to each word of the words 24 of the CAM 11, where J is a natural number equal to or greater than two, and is determined such that it takes the maximum value within the allowable bit number. The word mapping of the CAMs is implemented in the same manner in the eight-neighbor or 24-neighbor cases. Such arrangement can include greater number of PEs in the same number of CAMs, thereby implementing a two-dimensional PE array with a smaller amount of hardware.

Thus, the inner word transfer is carried out when a plurality of PEs are assigned to each word of the CAMs.

In summary, in the two-dimensional PE array PEA3, a plurality of PEs are mapped to each word of the CAMs, and each PE includes its current value field, its next value field, and respective value fields of the neighboring PEs. Thus mapping a plurality of PEs to each word of the CAMs makes it possible to implement the two-dimensional PE array with a reduced amount of hardware because more PEs can be mounted in the same number of CAMs.

EMBODIMENT 4

Next, a fourth embodiment of the two-dimensional PE array in accordance with the present invention will be described. The CAMs of the array is provided with a mode in which data write to or data read from the words 24 by using address can be simultaneously carried out with the shift up or shift down operation.

In other words, the CAMs of the fourth embodiment has a mode which simultaneously performs the data write or data read of the words 24 by using the address, and the shift of the hit-flag register, in the CAMs having data write and read function of words by using the address and a hit-flag shift mode.

Figure 14:
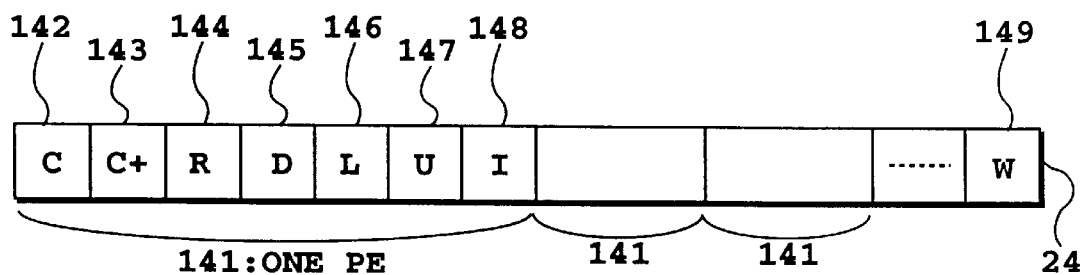
FIG. 14 is a diagram illustrating the word mapping of the CAM for implementing a two-dimensional PE array with a data transfer function to the four neighboring PEs, right, down, left and up PEs.

FIG. 14 is a diagram illustrating the mapping of the words of the CAMs to implement a two-dimensional PE array including the data transfer function to the four neighboring PEs of right, down, left and up.

As shown in FIG. 14, a PE 141 includes a current value field C 142, a next value field C+ 143, a right PE value field R 144, a down PE value field D 145, a left PE value field L 146, an up PE value field U 147, and an identifier field I 148.

A set of J PEs 141 is assigned to each word of the words 24 of the CAMs 11, where J is a natural number equal to or greater than two, and is determined such that it takes the maximum value within the allowable bit number. The work field W 149 is a temporary area for carrying out various calculations by using the data in the current value field C 142 and the neighboring PEs.

Figure 15:
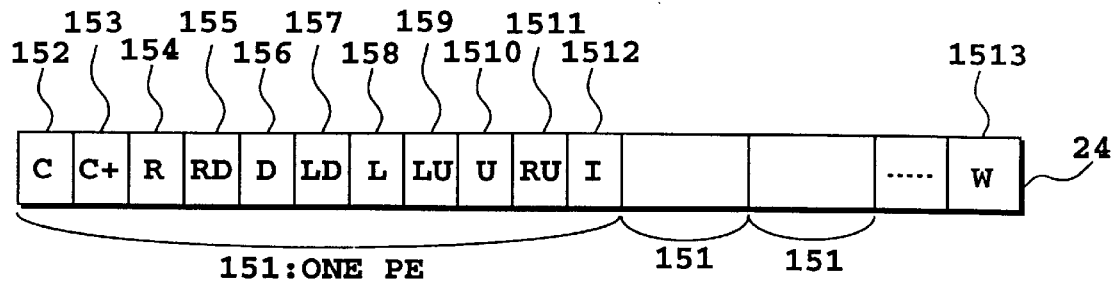
FIG. 15 is a diagram illustrating the word mapping of the CAM for implementing a two-dimensional PE array with a data transfer function to the eight neighboring PEs, right, right down, down, left down, left, left up, up and right up PEs.

FIG. 15 is a diagram illustrating the mapping of the words 24 in the CAM for implementing the two-dimensional PE array having a data transfer function to the eight neighboring PEs of right, right down, down, left down, left, left up, up, and right up.

As shown in FIG. 15, a PE 151 includes a current value field C 152, a next value field C+ 153, a right PE value field R 154, a right down PE value field RD 155, a down PE value field D 156, a left down PE value field LD 157, a left PE value field L 158, a left up PE value field LU 159, an up PE value field U 1510, a right up PE value field RU 1511, and an identifier field I 1512. J PEs 151 are assigned to each word of the words 24 of the CAMs 11, where J is a natural number, and is determined such that it takes the maximum value within the allowable bit number. A work field W 1513 is a temporary field for various calculations using data in the current value field C 152 and the neighboring PEs.

Figure 16:
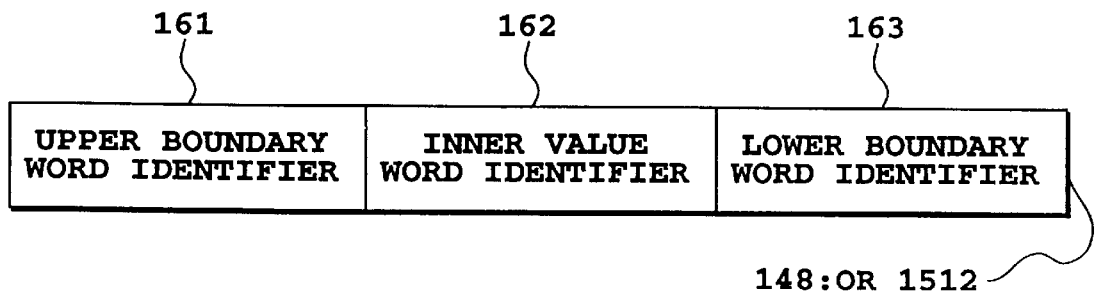
FIG. 16 is a diagram illustrating an identifier field I 148 or 1512.

FIG. 16 is a diagram illustrating the identifier field I 148 or 1512.

The identifier field I 148 or 1512 includes three bits, an upper boundary word identifier 161, an inner word identifier 162 and a lower boundary word identifier 163. When the power supply is turned on, only the upper boundary word identifier 161 is set at "1" with the remainder being kept "0" if the word belongs to the upper boundary words 13, only the inner word identifier 162 is set at "1" with the remainder being kept "0" if the word belongs to the inner words 14, and only the lower boundary word identifier 163 is set at "1" with the remainder being kept "0" if the word belongs to the lower boundary words 15.

Figure 17:
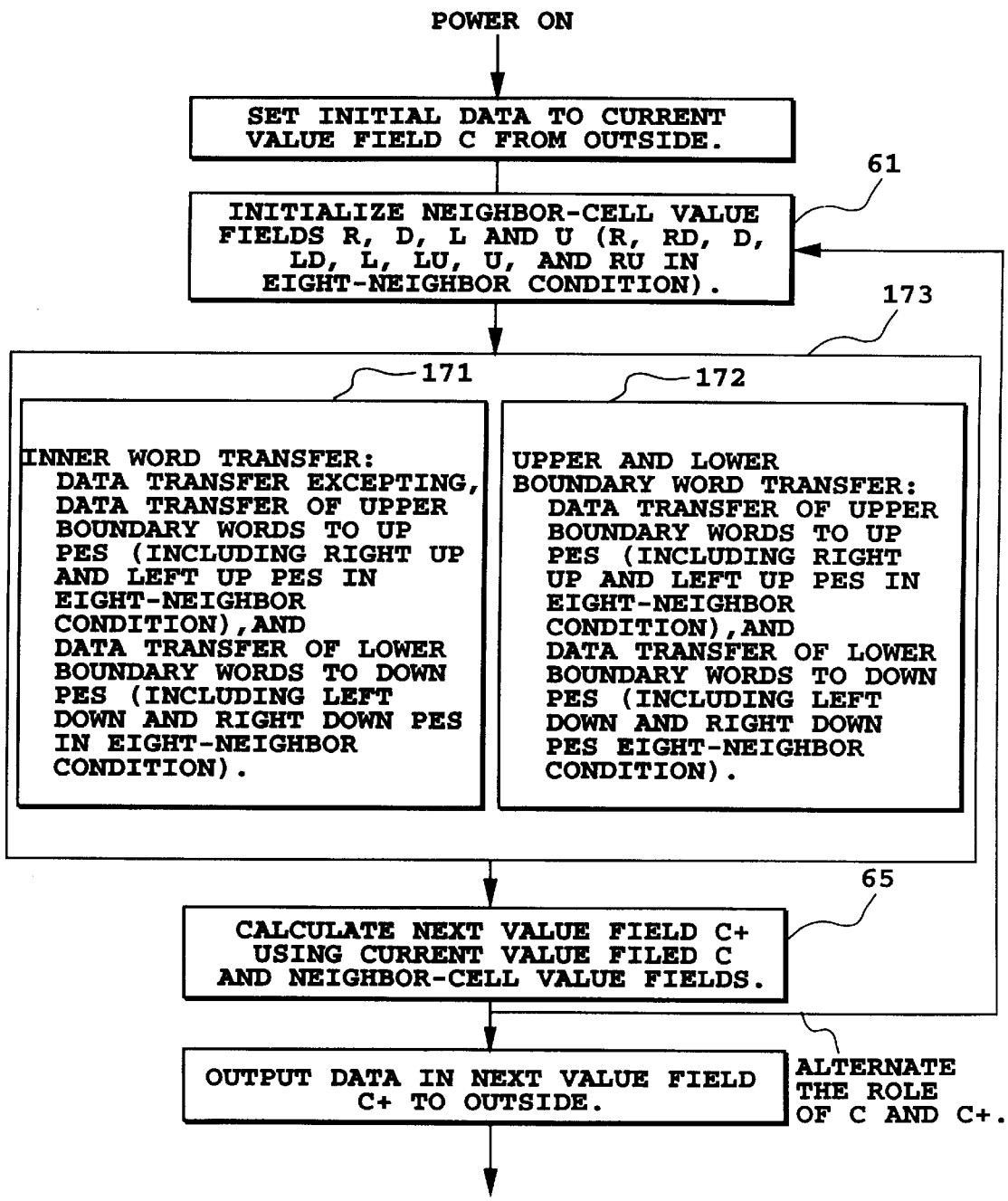
FIG. 17 is a flowchart illustrating the overall processing procedure for carrying out various types of processings by using the two-dimensional PE array with the foregoing configuration.

FIG. 17 is a flowchart illustrating the overall processing procedure of various calculations using the two-dimensional PE array with the foregoing arrangement.

The same procedure as that of FIG. 6 is employed excepting the data transfer 173 to neighboring PEs.

Figure 18:
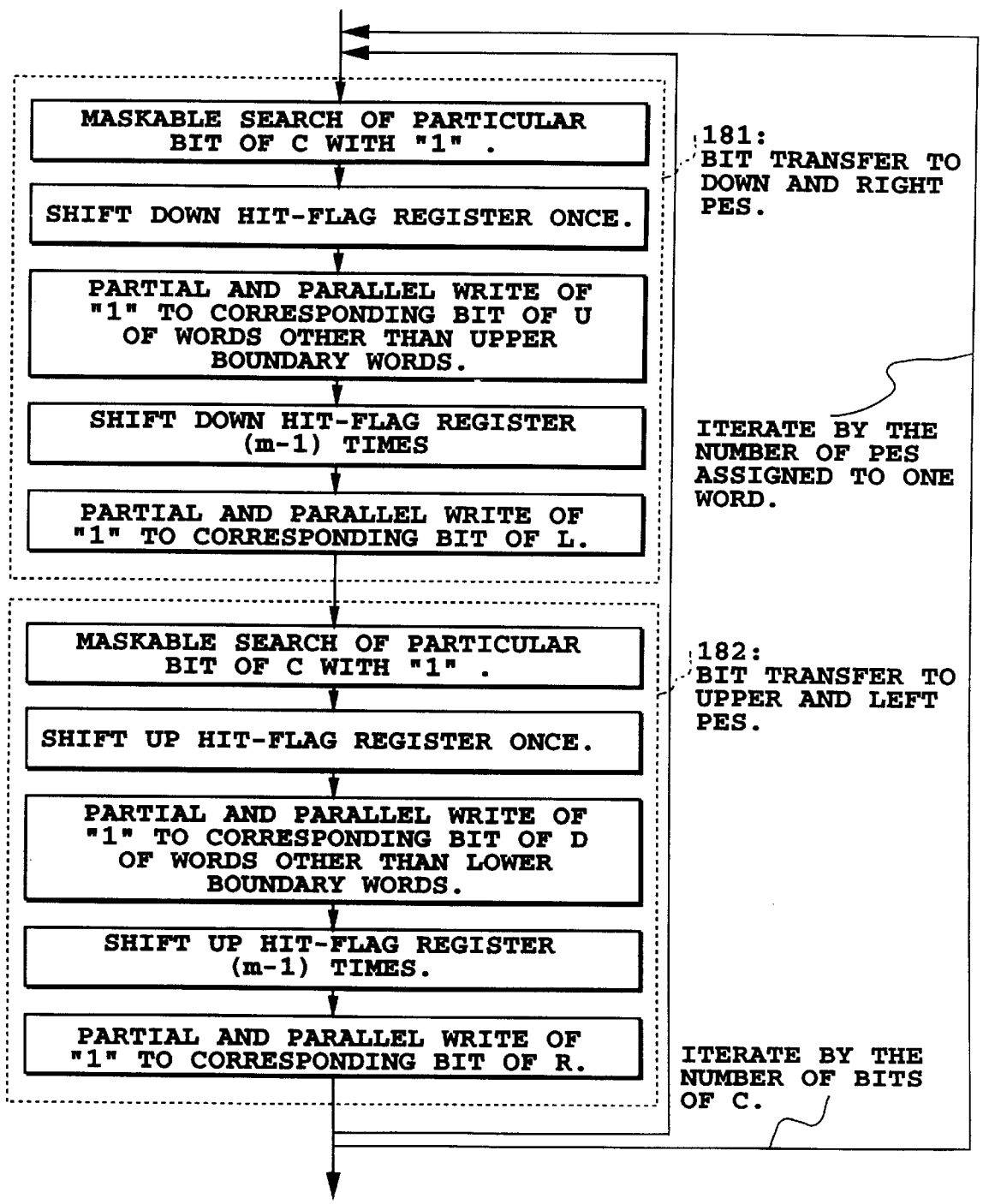
FIG. 18 is a flowchart illustrating a four-neighbor inner word transfer procedure associated with inner word transfer 171 of data transfer 173 to the neighboring PEs.

FIG. 18 is a flowchart illustrating a four-neighbor inner word transfer procedure associated with the inner word transfer 171 of the data transfer 173 to the neighboring PEs.

Figure 19B:
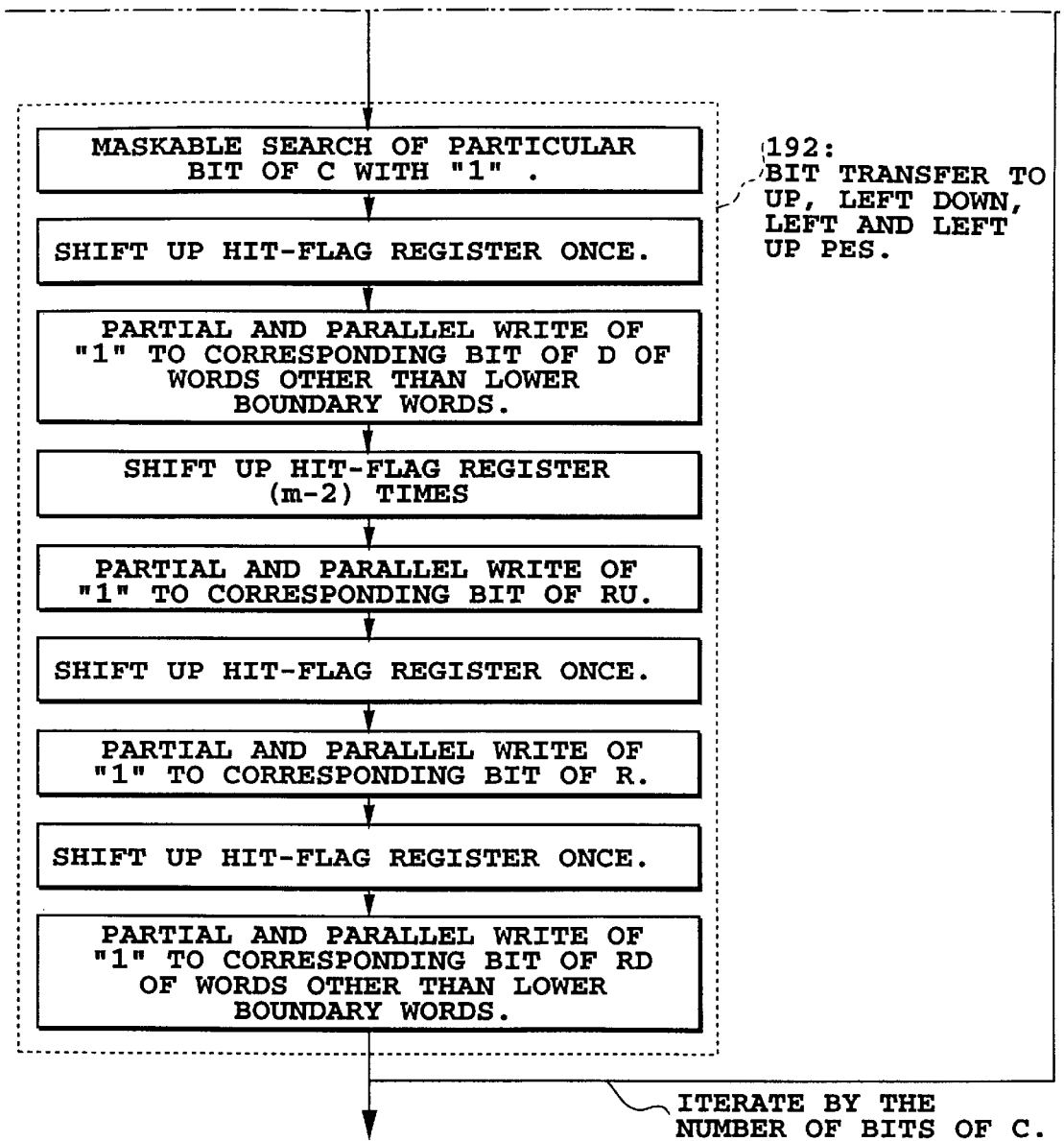
FIG. 19B is a flowchart illustrating an eight-neighbor inner word transfer procedure associated with inner word transfer 171 of data transfer 173 to the neighboring PEs.

FIGS. 19A and FIG. 19B are a flowchart illustrating an eight-neighbor inner word transfer procedure associated with the inner word transfer 171 of the data transfer 173 to the neighboring PEs.

As shown in FIG. 18, the four-neighbor inner word transfer 171 consists of two stages, bit transfer 181 to the down and right PEs, and bit transfer 182 to the up and left PEs. In the down or right bit transfer 181, the content of a particular bit in C 142 is transferred to the hit-flag register 27 by setting in the mask register 22 masking data that masks bits other than the particular bit in C 142, and by carrying out the maskable search using "1".

Subsequently, the hit-flag register 27 is shifted down once. Then, the partial and parallel write of "1" is carried out to the corresponding bit of U 147 of the words whose hit-flag register 27 is "1" and which do not belong to the upper boundary words 13.

Whether the words belong to the upper boundary words 13 or not is detected by searching the identifier field 148. Thus, the bit transfer to the down PEs is achieved. After that, the hit-flag register 27 is shifted down (m-1) times, and then the partial and parallel write of "1" is performed to the corresponding bit of L 146 of the words whose hit-flag register 27 is "1". Thus, the bit transfer to the right PEs is achieved.

In the up or left bit transfer 182, the content of a particular bit in C 142 is transferred to the hit-flag register 27 by setting in the mask register 22 masking data that masks bits other than the particular bit in C 142, and by carrying out the maskable search using "1". Then, the hit-flag register 27 is shifted up once. Subsequently, the partial and parallel write of "1" is carried out to the corresponding bit of D 145 of the words whose hit-flag register 27 is "1", and which do not belong to the lower boundary words 15. Whether the words belong to the lower boundary words 15 or not is detected by searching the identifier field 148. Thus, the bit transfer to the up PEs is achieved.

After that, the hit-flag register 27 is shifted up (m-1) times, and then the partial and parallel write of "1" is performed to the corresponding bit of R 144 of the words whose hit-flag register 27 is "1". Thus, the bit transfer to the left PEs is achieved.

The foregoing procedures are iterated by the number of bits of C 142, and further iterated, when the plurality of PEs are assigned to each word, by that amount, to complete the entire four-neighbor inner word transfer.

As shown in FIGS. 19A and FIG. 19B, the eight-neighbor inner word transfer consists of two stages, a first stage 191 for transferring a bit to the down, right up, right or right down PE, and a second stage 192 for transferring a bit to the up, left down, left or left up PE.

In the bit transfer 191 to the down, right up, right or right down PE, the content of a particular bit in C 152 is transferred to the hit-flag register 27 by setting in the mask register 22 masking data that masks bits other than the particular bit in C 152, and by carrying out the maskable search using "1". Then, the hit-flag register 27 is shifted down once. Subsequently, the partial and parallel write of "1" is carried out to the corresponding bit of U 1510 of the words whose hit-flag register 27 is "1", and which do not belong to the upper boundary words 13. Whether the words belong to the upper boundary words 13 or not is detected by searching the identifier field 1512. Thus, the bit transfer to the down PEs is achieved.

After that, the hit-flag register 27 is shifted down (m-2) times, and then the partial and parallel write of "1" is performed to the corresponding bit of LD 157 of the words whose hit-flag register 27 is "1". Thus, the bit transfer to the right up PEs is achieved.

Subsequently, the hit-flag register 27 is shifted down once, and then the partial and parallel write of "1" is carried out to the corresponding bit of L 158 of the words whose hit-flag register 27 is "1". Thus, the bit transfer to the right PEs is achieved.

After that, the hit-flag register 27 is shifted down once, and then the partial and parallel write of "1" is performed to the corresponding bit of LU 159 of the words whose hit-flag register 27 is "1", and which do not belong to the upper boundary words 13. Whether the words belong to the upper boundary words 13 or not is detected by searching the identifier field 1512. Thus, the bit transfer to the right down PEs is achieved.

In the bit transfer 192 to the up, left down, left or left up PE, the content of a particular bit in C 152 is transferred to the hit-flag register 27 by setting in the mask register 22 masking data that masks bits other than the particular bit in C 152, and by carrying out the maskable search using "1".

Then, the hit-flag register 27 is shifted up once. Subsequently, the partial and parallel write of "1" is carried out to the corresponding bit of D 156 of the words whose hit-flag register 27 is "1", and which do not belong to the lower boundary words 15. Whether the words belong to the lower boundary words 15 or not is detected by searching the identifier field 1512. Thus, the bit transfer to the up PEs is achieved.

After that, the hit-flag register 27 is shifted up (m-2) times, and then the partial and parallel write of "1" is performed to the corresponding bit of RU 1511 of the words whose hit-flag register 27 is "1". Thus, the bit transfer to the left down PEs is achieved.

Subsequently, the hit-flag register 27 is shifted up once, and then the partial and parallel write of "1" is carried out to the corresponding bit of R 154 of the words whose hit-flag register 27 is "1". Thus, the bit transfer to the left PEs is achieved.

After that, the hit-flag register 27 is shifted up once, and then the partial and parallel write of "1" is performed to the corresponding bit of RD 155 of the words whose hit-flag register 27 is "1", and which do not belong to the lower boundary words 15. Whether the words belong to the lower boundary words 15 or not is detected by searching the identifier field 1512. Thus, the bit transfer to the left up PEs is achieved.

The foregoing procedures are iterated by the number of bits of C 152, and further iterated, when the plurality of PEs are assigned to each word, by that amount, to complete the eight-neighbor inner word transfer in its entirety.

The 24 or more neighbor inner word transfer can be achieved in the same manner as that of the four-or eight-neighbor inner word transfer.

The upper and lower boundary word transfer 172 is carried out in the same manner as those in the foregoing embodiments.

Next, the relationship of procedures for performing the inner word transfer 171 and the upper or lower boundary word transfer 172 will be described.

The upper and lower boundary word transfer 172 is simultaneously carried out with the shift down and shift up operation in the inner word transfer procedure 171. Specifically, the inner word transfer 171 and the upper and lower boundary word transfer 172 can be performed simultaneously by using a CAM having a mode in which the shift mode of the hit-flag register (which is used in the inner word transfer 171) can be carried out simultaneously with the data write to and data read from the words of the CAM by using address (which is used in the upper and lower boundary word transfer 172).

In addition, since the inner word transfer 171 prevents non-corresponding data from being written, for example, into U 147 of the upper boundary words 13, such a problem as correct data is overwritten does not arise from simultaneous processing of the inner word transfer 171 and the upper and lower boundary word transfer 172.

Furthermore, simultaneous processing of the inner word transfer 171 and the upper and lower boundary word transfer 172 can shorten the transfer time as compared with the sequential processing of the inner word transfer 171 and the upper and lower boundary word transfer 172.

Thus, using the CAMs, which can perform the data write to or data read from words by using address simultaneously with the shift mode of the hit-flag register, allows the data transfer 171 and 172 to be achieved at the same time.

The simultaneous processing of the data write to or data read from words by using address, and the shift mode of the hit-flag register also makes it possible to simultaneously perform the data transfer between the PEs in the horizontal direction, and the word transfer between the CAMs in the vertical direction. This also serves to reduce the data transfer time, in which case the shift mode can be applied to either the bidirectional and unidirectional shift.

EMBODIMENT 5

Figure 22:
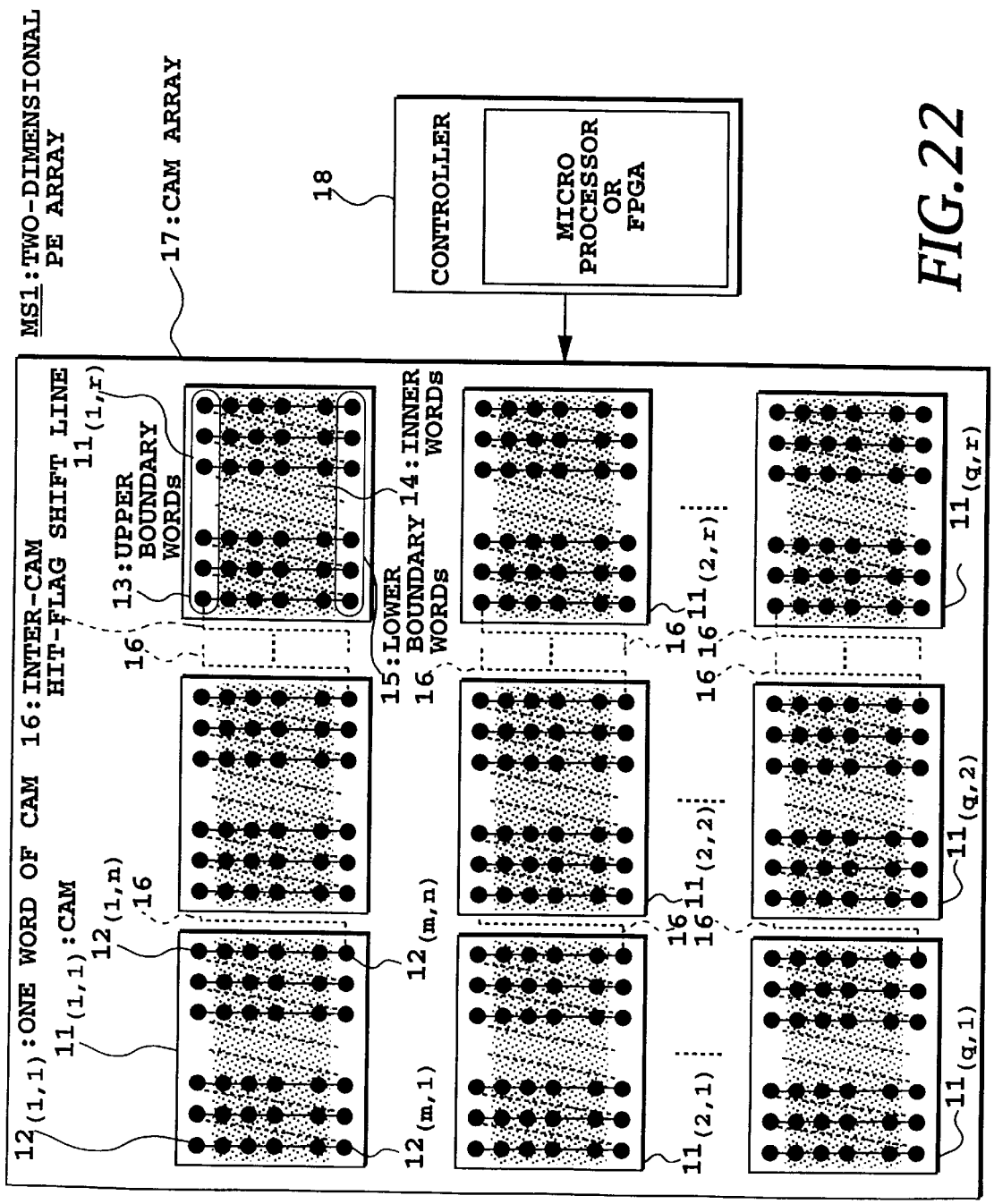
FIG. 22 is a block diagram showing a basic structure of a two-dimensional PE array MS1 of another embodiment in accordance with the present invention.

FIG. 22 is a block diagram showing the basic configuration of a two-dimensional PE array MS1 which executes mathematical morphology processing of an embodiment in accordance with the present invention.

The two-dimensional PE array MS1 comprises a CAM array 17 and a controller 18. The CAM array 17 comprises two-dimensionally arrayed q×r CAMs 11, where q and r are any integer equal to or greater than two.

Each of the CAMs 11 configuring the mathematical morphology processor MS1 is basically the same as the CAM $11_{(1,1)}$ as shown in FIG. 2, comprising the w words 24, where w is any natural number, the address decoder 25, the hit-flag register 27 capable of shift up and shift down, and the upper shift I/O port 26 and the lower shift I/O port 29 which externally input and output the contents of the hit-flag register 27. The words 24 in the CAMs 11 employed in the two-dimensional PE array MS1 are one-dimensionally arrayed words including a original image field, a next image field and a shift image field.

Using the maskable search, and partial and parallel write, which are described in connection with FIG. 2, makes it possible to perform on the entire words 24 any logical and arithmetic operations including addition, substraction, comparing, and logical OR operation. Concrete procedures of the operations are disclosed, for example, in T. Ogura and J. Naganuma, "Neural Network Algorithms on a Highly Parallel Associative Processor", Technical Report of the Institute of Electronics, Information and Communication Engineers of Japan, CPSY91-44, 1991.

Giving attention to a CAM 11, it is connected to one of horizontally adjacent CAMs through the lower shift I/O port and the hit-flag shift line 16, and to the other of the horizontally adjacent CAMs through the upper shift I/O port and the hit-flag shift line 16. This will make it possible for the horizontally adjacent CAMs to systematically carry out operations such as shift up and shift down as one integrated memory.

The w words in each CAM 11 are each assigned to one of the PEs (processing elements) which are arranged in m rows and n columns in a zigzag to carry out various types of logical and arithmetic operation, where w, m and n are any natural number satisfying the relation w=m×n. Each CAM 11 can form an m×n two-dimensional PE array, and hence the entire CAM array 17 can implement a two-dimensional PE array including m×q elements in the vertical direction, and n×r elements in the horizontal direction. Thus, in the CAM array 17, m×q is the number of pixels in the vertical direction, and n×r is the number of pixels in the horizontal direction of a original image. Hence, a PE array can be implemented whose number of PEs equal to the number of pixels of the original image by determining m, q, n and r accordingly.

The controller 18 generates a single control instruction stream to have the CAM array 17 carry out the mathematical morphology processing. It is constructed with a reconfigurable circuit like an FPGA (field programmable gate array).

Figure 23:
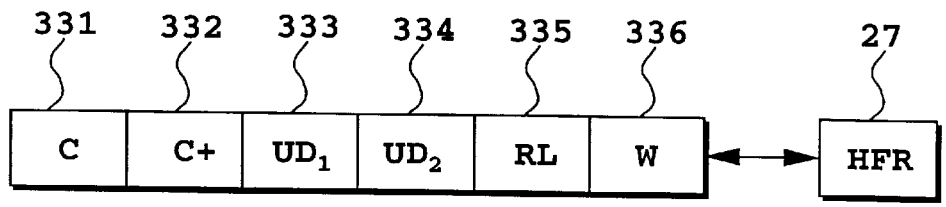
FIG. 23 is a diagram illustrating in detail the field structure of each word 24 in the CAMs 11 employed in the two-dimensional PE array MS1.

FIG. 23 is a diagram illustrating in detail the field structure of each word 24 in the CAM 11 used in the two-dimensional PE array MS1.

Each word 24 includes an original image field C 331 for storing each image data of the original image, a next image field C+ 332 for storing each image data after the mathematical morphology processing, a shift image field $UD_1$ 333 for storing the shift up or shift down data of the original image, a shift image field $UD_2$ 334, and a shift image field RL 335 for storing original image data of left and right PEs. A work field W 336 is a temporary area used for various types of operations of the data in the original image field C 331, or the shift image fields $UD_1$ 333, $UD_2$ 334 and RL 335.

Next, the operation will be described in detail which is associated with the single control instruction stream generated by the controller 18 for the mathematical morphology processing. First, the outline of the mathematical morphology operation will be described.

The mathematical morphology operation have four basic operations, dilation, erosion, closing and opening.

Figure 24:
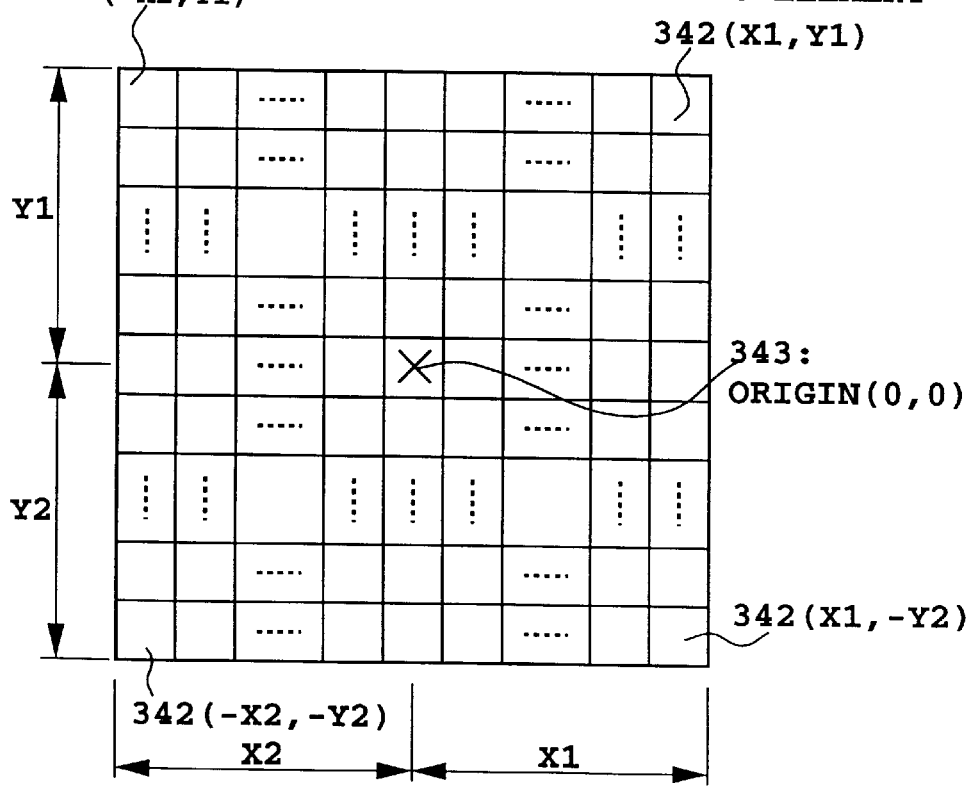
FIG. 24 is a diagram defining a structuring element of the mathematical morphology.

FIG. 24 is a diagram defining a structuring element of the mathematical morphology.

The "dilation" is defined, for each pixel of the original image, as a result obtained by operation using the data of only the original pixel and the original images of the neighboring pixels. In FIG. 22, the dilation is defined as a result of operation performed on the original pixel (PE) at the origin 343 and the original images of the neighboring pixels (PEs) in a structuring element 341 composed of pixels present in an area of (−X2, −Y2)–(X1, Y1), where X1, X2, Y1 and Y2 are any integer equal to or greater than zero, and the structuring element 341 is defined as "1" when it is binary, and as "data is present" when it is multivalued. For example, when the structuring element 341 is defined at (0,0), (1,1), (1,−1), (−1,1), and (−1,−1), the dilation is a result of the operation performed on the data of the original pixel and the original images of the four neighbors, up, down, left and right pixels in the original image.

The operation is a logical OR operation when both the original image and the structuring element 341 are binary (set processing), in which case, "1" is output if at least one data is "1" in the original pixel and the original images of the four neighbors. The operation calculates the maximum value when the original image is multivalued and the structuring element 341 is binary (function and set processing), in which case, the maximum value is obtained in the data of the original pixel and the original images of the four neighbors. The operation calculates the maximum value after adding the values of the structuring element 341 when both the original image and the structuring element 341 are multivalued (function processing).

The "erosion" can be handled in roughly a similar manner to the dilation. The operation in the erosion, however, is performed as follows: a logical AND operation is carried out when both the original image and the structuring element 341 are binary, in which case, "1" is output if all data are "1" in the original pixels and the original images of the four neighbors; the minimum value is obtained when the original image is multivalued and the structuring element 341 is binary, in which case, the minimum value is obtained in the data of the original pixel and the original images of the four neighbors; and the minimum value is obtained after subtracting the value of the structuring element 341 when both the original image and the structuring element 341 are multivalued.

The "closing" is a result obtained by performing the dilation followed by the erosion, whereas the "opening" is a result obtained by performing the erosion followed by the dilation.

Figure 25B:
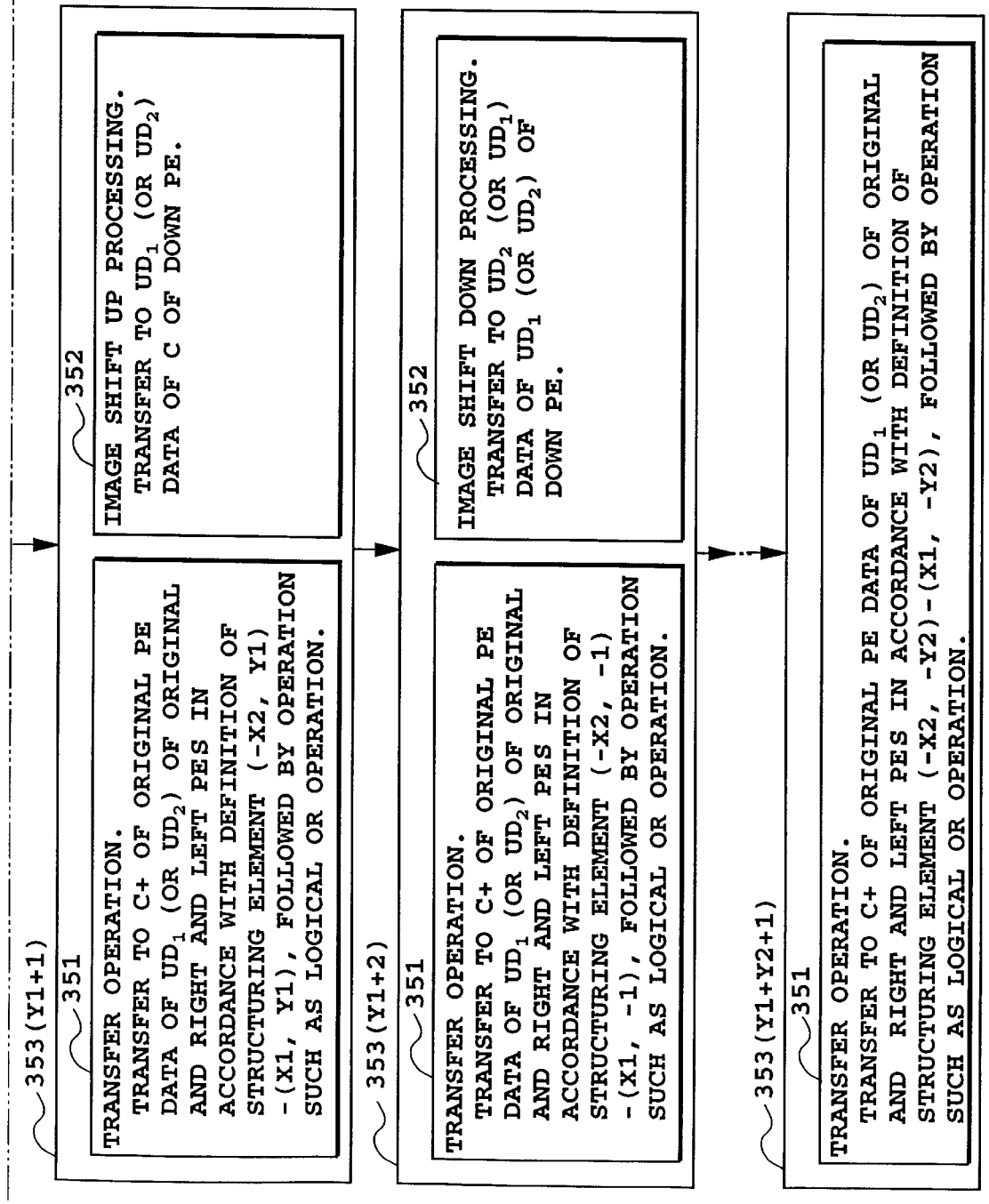
FIG. 25B is a flowchart illustrating an overall output procedure of the mathematical morphology processor in the embodiment.

FIG. 25A and FIG. 25B are a flowchart illustrating the entire output procedure in the mathematical morphology operation.

First, each pixel data of the two-dimensional original image is transferred to the original image field C 331 of the corresponding PE (that is, the word 24) in the CAM array 17. Then, the next image field C+ 332 is initialized.

Next, a transfer operation 351 and an image shift processing 352 are carried out in parallel at step 353(1) of the mathematical morphology operation. In the transfer operation 351, in accordance with the definition of the structuring element in the area (−X2, 0)–(X1, 0), the data of the original PE 12 and the data in the original image fields C 331 of its left and right PEs 12 are transferred to the original PE 12 which carries out an operation, and stores the result of the operation in the next image field C+ 332. The operation here, for example, is the logical OR operation in the case of dilation when both the original image and the structuring element 341 are binary. The image shift down processing 352 transfers the original image field C 331 of the up PE 12 to the shift image field $UD_1$ 333, thereby storing in the shift image field $UD_1$ 333 the data obtained by shifting down the data in the original image field C 331 by one pixel.

Next, the transfer operation 351 and the image shift down processing 352 are carried out in parallel at step 353(2) of the mathematical morphology operation. In the transfer operation 351, in accordance with the definition of the structuring element in the area (−X2, 1)–(X1, 1), the data of the original PE 12 and the data in the shift image fields $UD_1$ 333 of its left and right PEs 12 are transferred to the original PE 12 which carries out the operation, and stores the result of the operation in the next image field C+ 332. The image shift down processing 352 transfers the shift image field $UD_1$ 333 of the up PE 12 to the shift image field $UD_2$ 334.

Similar processings are iterated from step 353(3) to step 353(Y1). In this case, the image shift processing 352 is carried out by alternating the shift image field $UD_1$ 333 and the shift image field $UD_2$ 334.

Next, the transfer operation 351 and the image shift processing 352 are carried out in parallel at step 353(Y1+1) of the mathematical morphology operation. In the transfer operation 351, in accordance with the definition of the structuring element in the area (−X2, Y1)–(X1, Y1), the data of the original PE 12 and the data in the shift image fields $UD_1$ 333 (or the shift image field $UD_2$ 334) of its left and right PEs 12 are transferred to the original PE 12 which carries out the operation, and stores the result of the operation in the next image field C+ 332. The image shift up processing 352 transfers the original image field C 331 of the down PE 12 to the shift image field $UD_1$ 333 (or the shift image field $UD_2$ 334), thereby storing in the shift image field $UD_1$ 333 (or the shift image field $UD_2$ 334) the data obtained by shifting up the data in the original image field C 331 by one pixel.

Next, the transfer operation 351 and the image shift up processing 352 are carried out in parallel at step 353(Y1+2) of the mathematical morphology operation. In the transfer operation 351, in accordance with the definition of the structuring element in the area (−X2, −1)–(X1, −1), the data of the original PE 12 and the data in the shift image fields $UD_1$ 333 (or the shift image fields $UD_2$ 334) of its left and right PEs 12 are transferred to the original PE 12 which carries out the operation, and stores the result of the operation in the next image field C+ 332. The image shift up processing 352 transfers the shift image field $UD_1$ 333 (or the shift image field $UD_2$ 334) of the down PE 12 to the shift image field $UD_2$ 334 (or the shift image field $UD_1$ 333).

Similar processings are iterated from step 353(Y1+3) to step 353(Y1+Y2). In this case, the image shift processing 352 is carried out by alternating the shift image field $UD_1$ 333 and the shift image field $UD_2$ 334.

Finally, the transfer operation 351 is carried out at step 353(Y1+Y2+1) of the mathematical morphology operation. In the transfer operation 351, in accordance with the definition of the structuring element in the area (−X2, −Y2)–(X1, −Y2), the data of the original PE 12 and the data in the shift image fields $UD_1$ 333 (or the shift image fields $UD_2$ 334) of its left and right PEs 12 are transferred to the original PE 12 which carries out the operation, and stores the result of the operation in the next image field C+ 332.

Figure 26:
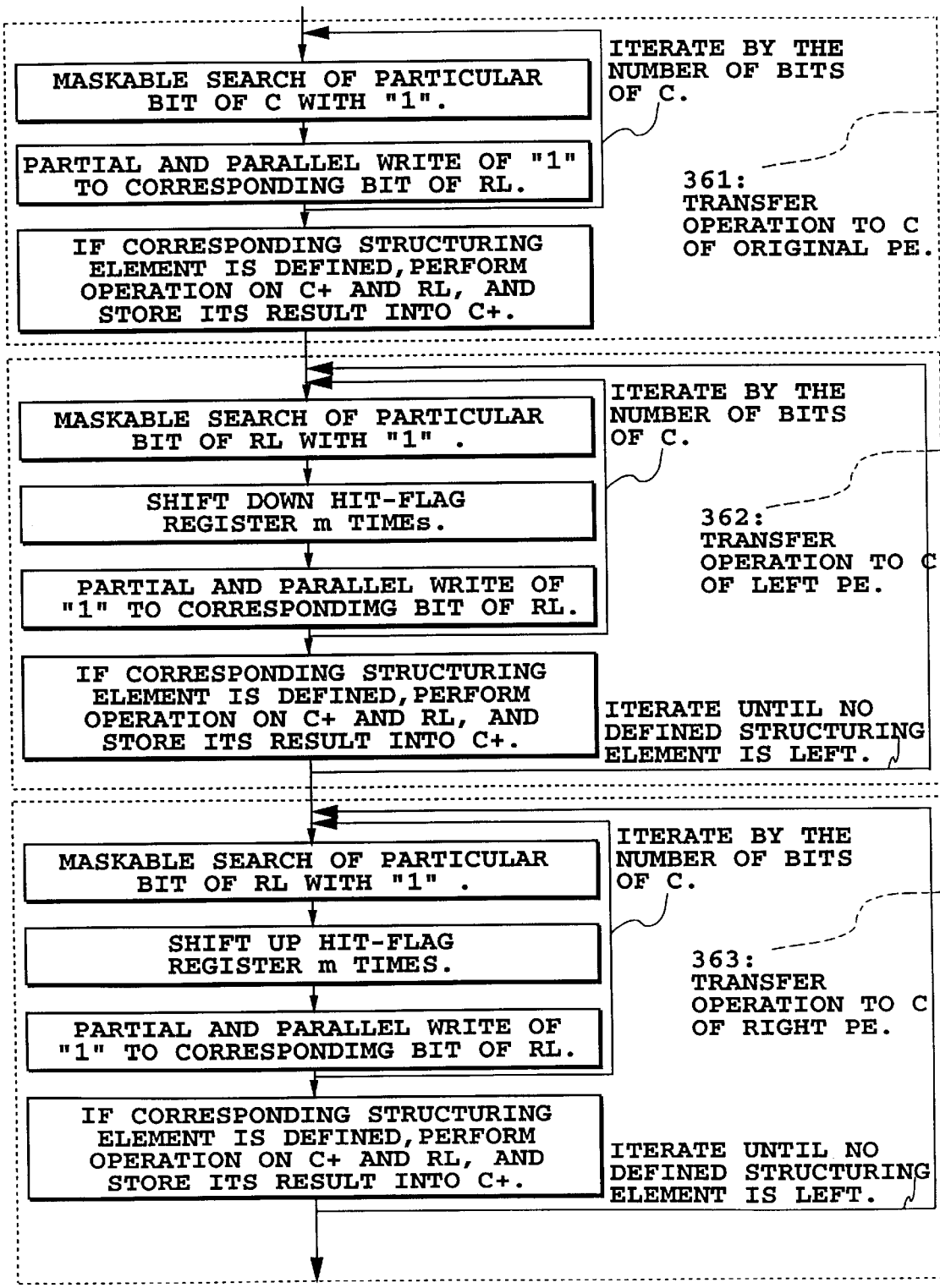
FIG. 26 is a flowchart illustrating a transfer operation 351 in detail by taking processing step 353(1) as shown in FIG. 25 as an example.

FIG. 26 is a flowchart illustrating the transfer operation 351 in detail by taking the step 353(1) shown in FIG. 25A and FIG. 25B as an example.

The transfer operation 351 is divided into three operations to be performed: a transfer operation 361 to the original PE 12; a transfer operation 362 to the left PE 12; and a transfer operation 363 to the right PE 12.

In the transfer operation 361 to the original PE 12, the content of a particular bit of the original image field C 331 is transferred to the hit-flag register 27 by setting in the mask register of the CAM 11 data for masking the bits other than the particular bit of the original image field C 331, and by carrying out the maskable search using "1".

Subsequently, the partial and parallel write is carried out into the corresponding bit of the shift image field RL 335 in words whose hit-flag register is "1". The foregoing procedures are iterated by the number of bits in the original image field C 331.

Following this, if the corresponding structuring element (the origin (0,0) in this case) is defined, an operation is carried out, and its result is stored in the next image field C+ 332. The operation here, for example, is the maximum value calculation for dilation when the original image is multivalued and the structuring element 341 is binary.

In the transfer operation 362 to the left PE 12, the content of a particular bit of the shift image field RL 335 (of the original image field C 331 in the case of the initial word) by setting data in the mask register 22 data that masks bits other than the particular bit of the shift image field RL 335 (the original image field C 331 in the case of the initial word), and by carrying out maskable search using "1".

Then, the partial and parallel write of "1" is performed to the corresponding bit of the shift image field RL 335 of words whose hit-flag register 27 is "1" by shifting down the hit-flag register 27 m times. The foregoing procedures are iterated by the number of bits of the shift image field RL 335. Subsequently, if the corresponding structuring element (in this case, (−1, 0)) is defined, the operation is carried out, and its result is stored in the next image field C+ 332. The foregoing procedures are iterated until no structuring element defined in (−2, 0)–(−X2, 0) is left.

In the transfer operation 363 to the right PE 12, the content of a particular bit of the shift image field RL 335 (of the original image field C 331 in the case of the initial word) by setting data in the mask register 22 data that masks bits other than the particular bit of the shift image field RL 335 (the original image field C 331 in the case of the initial word), and by carrying out maskable search using "1".

Then, the partial and parallel write of "1" is performed to the corresponding bit of the shift image field RL 335 of words whose hit-flag register 27 is "1" by shifting up the hit-flag register 27 m times. The foregoing procedures are iterated by the number of bits of the shift image field RL 335. Subsequently, if the corresponding structuring element (in this case, (1, 0)) is defined, the operation is carried out, and its result is stored in the next image field C+ 332. The foregoing procedures are iterated until no structuring element defined in (2, 0)–(X1, 0) is left.

Thus, the mathematical morphology operation has been completed for the structuring element in the area (−X2, 0)–(X1, 0) by the foregoing processings which perform the transfer processings from step 2 to step (Y1+Y2+1) in a similar manner. With the completion of the entire steps, the mathematical morphology processings for the entire structuring elements have been finished.

Figure 27:
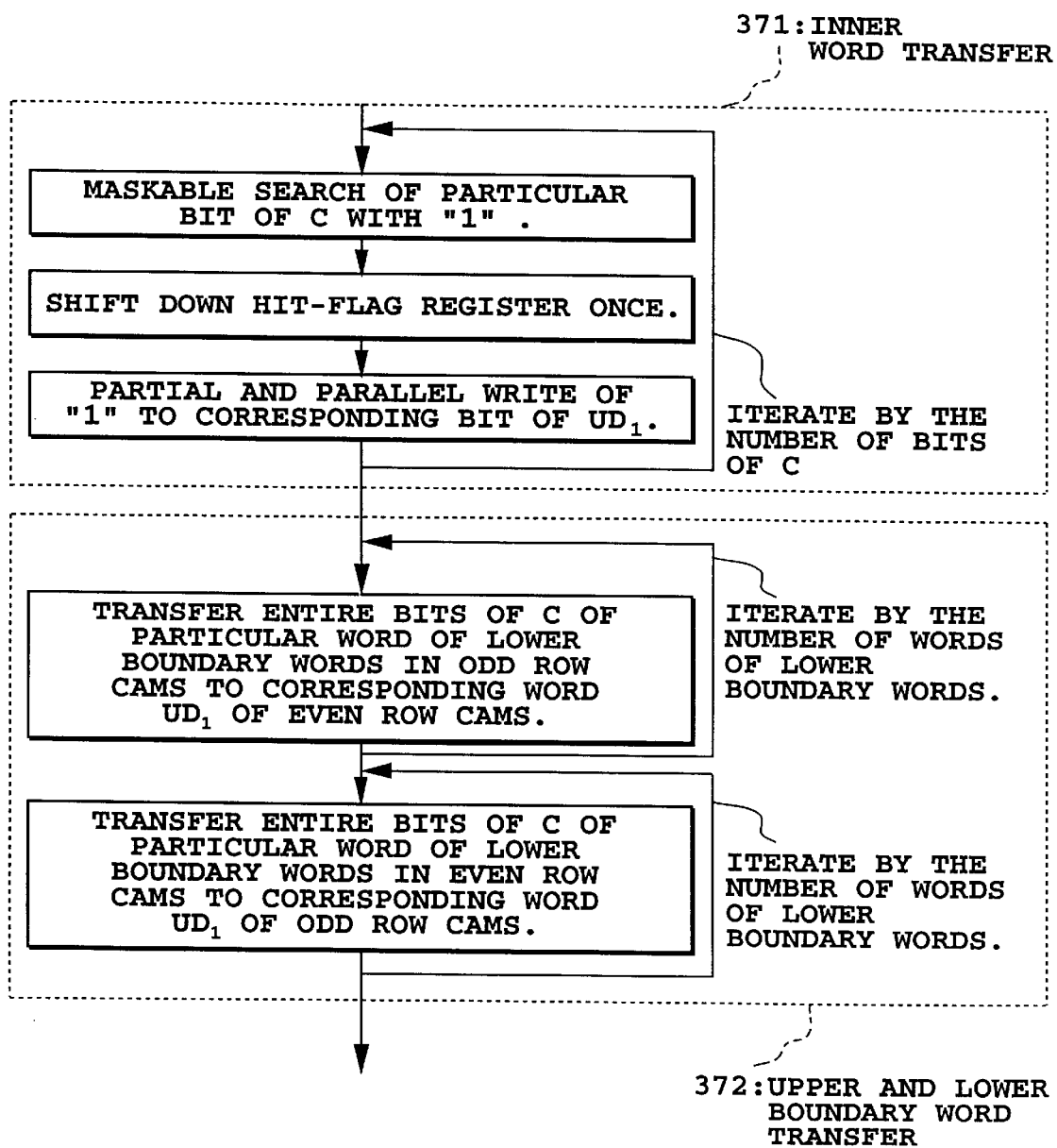
FIG. 27 is a flowchart illustrating an image shift processing procedure 252 in detail by taking the processing step 353(1) as an example.

FIG. 27 is a flowchart illustrating the image shift processing procedure 352 in detail, taking processing step 353(1) as an example.

The image shift processing procedure 352 carries out separately the inner word transfer 371, and the upper and lower boundary word transfer 372, wherein the former is the data transfer excepting the data transfer of the lower boundary words 15 to the down PEs, and the latter is the data transfer of the lower boundary words 15 to the down PEs.

In the inner word transfer 371, the content of a particular bit of the original image field C 331 is transferred to the hit-flag register 27 by setting in the mask register 22 data that masks the bits of the original image field C 331 excepting the particular bit, and then by performing the maskable search using "1". Subsequently, the partial and parallel write of "1" is carried out to the corresponding bit of the shift image field $UD_1$ 333 of words whose hit-flag register 27 is "1" by shifting down the hit-flag register 27 once. The procedure is iterated by the number of bits of the original image field C 331.

In the upper or lower boundary word transfer 372, the entire bits of the original image field C 331 of a particular word of the lower boundary words 15 in the odd row CAMs 91 are transferred to the shift image field $UD_1$ 333 of the corresponding word of the upper boundary words 13 in the even row CAMs 92. Then, the entire bits of the original image field C 331 of a particular word of the lower boundary words 15 in the even row CAMs 92 are transferred to the shift image field $UD_1$ 333 of the corresponding word of the upper boundary words 13 in the odd row CAMs 91. These transfer operations are performed with the data write and data read using the address of the CAMs 11.

The above processings can be applied to the shift up processings at step 353(Y1+1) and so on in a similar manner.

The hit-flag register 27 has a mode in which its shift operation is carried out simultaneously with the data write and data read using the address. Thus, the upper and lower boundary word transfer 372 in the image shift processing procedure 352 can be performed simultaneously with the shift up and shift down of the hit-flag register 27 in the transfer operation 351, thereby improving the efficiency of the mathematical morphology processing.

Since the two-dimensional PE array processor MS1 of the present embodiment has the same number of PEs as that of the pixels of the original image, the processing speed is independent of the size of the original image. In addition, there is no limit to the size of structuring elements that can be processed, because the mathematical morphology processing is carried out by providing the words of the CAMs with the shift image field, and by sequentially transferring to the shift image field its neighboring pixels' data. Accordingly, the mathematical morphology processing can be performed in a short time for a large size structuring element and original image, thus implementing a high performance mathematical morphology processor.

Furthermore, since the CAMs used in the foregoing embodiments can be configured based on very large scale integrated memory technique, each PE and data transfer path can be implemented with a small amount of hardware. Thus, the mathematical morphology processor MS1 can be implemented with a small amount of hardware, which can reduce the cost of the mathematical morphology processor MS1.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A two-dimensional PE (processing element) array comprising PEs, each of said PEs comprising:

q×r CAMs (content addressable memories), where q and r are any integers equal to or greater than two, each of said CAMs including one dimensionally arrayed w words, where w is any natural number, a hit-flag register having shift up and shift down functions, and an upper shift I/O port and a down shift I/O port for inputting from or outputting to outside contents of said hit-flag register; and hit-flag shift lines for connecting the lower shift I/O port of one CAM of two horizontally adjacent CAMs in said CAMs to the upper shift I/O port of the other CAM of said two horizontally adjacent CAMs, wherein each of said w words in each of CAMs is mapped successively to at least one of PEs which are arranged in m rows by n columns and are connected in a zigzag, where w,m and n are any natural numbers satisfying w=m×n, thereby forming a CAM array comprising m×q PEs in vertical direction and n×r PEs in a horizontal direction.

2. The two-dimensional PE array as claimed in claim 1, further comprising a controller for generating a single control instruction stream to be supplied to a CAM array formed by said CAMs and said hit-flag shift line.

3. The two-dimensional PE array as claimed in claim 1, wherein a plurality of PEs are mapped to each word of said CAMs, and wherein one of said plurality of PES mapped to each word of said CAMs comprises its current value field, its next value field, and a current value field and a next value field of its neighboring PEs.

4. A CAM (content addressable memory) comprising:

means for writing and reading data to and from words by using an address;

shift mode means for shifting contents of a hit-flag register; and means for simultaneously carrying out said shifting of the contents of said hit-flag register and the writing and reading of the data to and from said words by using an address.

5. The two-dimensional PE array as claimed in claim 1, wherein said CAM comprising:

means for writing and reading data to and from words by using an address;

shift mode means for shifting contents of a hit-flag register; and means for simultaneously carrying out said shifting of the contents of said hit-flag register and the writing and reading of the data to and from said words by using an address.

6. The two-dimensional PE array as claimed in claim 2, wherein said CAM comprising:

means for writing and reading data to and from words by using an address;

shift mode means for shifting contents of a hit-flag register; and means for simultaneously carrying out said shifting of the contents of said hit-flag register and the writing and reading of the data to and from said words by using an address.

7. The two-dimensional PE array as claimed in claim 3, wherein said CAM comprising:

means for writing and reading data to and from words by using an address;

shift mode means for shifting contents of a hit-flag register; and means for simultaneously carrying out said shifting of the contents of said hit-flag register and the writing and reading of the data to and from said words by using an address.

8. A data transfer method in a two-dimensional PE array comprising the steps of:

forming a one-dimensional array of w words, where w is any natural number;

transferring data between q×r CAMs (content addressable memories), where q and r are any integers equal to or greater than two, by external input and output of contents of a hit-flag register through an upper shift I/O port and a lower shift I/O port, said hit-flag register having shift up and shift down functions;

connecting with hit-flag shift lines the lower shift I/O port of one CAM of two horizontally adjacent CAMs of said CAMs to the upper shift I/O port of the other CAM of said two horizontally adjacent CAMs;

arranging w words in each of said CAMs in m rows by n columns in a zigzag fashion, where m and n are any natural number satisfying w=m×n; and mapping each of said w words in said CAMs to at least one of said PEs.

9. The data transfer method as claimed in claim 8, further comprising the steps of: mapping a plurality of PEs to each word of said CAMs; and providing one of said plurality of PEs mapped to each word of said CAMs with a current value field and a next value field of said one of said plurality of PEs, and with a current value field of its neighboring PEs.

10. A data transfer method between CAMs (content addressable memories) comprising the steps of:

forming a one-dimensional array of w words, where w is any natural number;

transferring data between q×r CAMs, where q and r are any integers equal to or greater than two, by external input and output of contents of a hit-flag register through an upper shift I/O port and a lower shift I/O port, said hit-flag register having shift up and shift down functions; and performing data transfer simultaneously from odd row CAMs to even row CAMs, and from said even row CAMs to said odd row CAMs of said CAMs arranged in q rows, said data transfer being carried out simultaneously for entire CAMs in each of said rows of said CAMs.

11. A data transfer method in CAM (content addressable memory) comprising the steps of:

forming a one-dimensional array of w words, where w is any natural number;

executing maskable search comparing date stored in said word with search data and ignoring the comparison of part of the search data;

transferring a content of a particular bit of a first word specified by said maskable search to a first hit-flag register having shift up and shift down functions;

shifting up or shifting down the first hit-flag register having the trasferred content and transferring the shifted content to a second hit-flag register of a second word; and transferring the content of the second hit-flag register to a particular bit of the second word, by using a partial and parallel write writing the search data into a bit of the second word corresponding to an unmasked bit of the search data, wherein the second hit-flag register of the second word has a particular value.

12. A CAM (content addressable memory) data transfer method comprising the steps of:

writing and reading data to and from words by using an address;

carrying out a shift mode of a hit-flag register; and performing simultaneously the shift mode of said hit-flag register and the writing and reading of said data to and from said words by using an address.

13. A two-dimensional PE array comprising:

q×r CAMs (content addressable memories), where q and r are any integers equal to or greater than two, each of said CAMs including one dimensionally arrayed w words each of which has an original image field, a next image field and a shift image field, where w is any natural number, a hit-flag register having shift up and shift down functions, and an upper shift I/O port and a down shift I/O port for inputting from or outputting to outside contents of said hit-flag register;

hit-flag connection lines for connecting the lower shift I/O port of one CAM of two horizontally adjacent CAMs of said CAMs to the upper shift I/O port of the other CAM of said two horizontally adjacent CAMs; wherein each of said w words in each of said CAMs is mapped successively to at least one of PEs which are arranged in m rows by n columns and are connected in a zigzag, where w, m and n are any natural numbers satisfying w=m×n, thereby forming a CAM array comprising m×q PEs in vertical direction and n×r PEs in a horizontal direction; and a controller for providing said CAM array with a single control instruction stream.

* * * * *